US012677688B2

(12) United States Patent
Kamgaing et al.

(10) Patent No.: US 12,677,688 B2
(45) Date of Patent: Jul. 7, 2026

(54) COAXIAL INDUCTORS FABRICATED THROUGH A DRILL-LESS VIA PROCESS

(71) Applicant: Intel Corporation, Santa Clara, CA (US)

(72) Inventors: Telesphor Kamgaing, Chandler, AZ (US); Georgios C. Dogiamis, Chandler, AZ (US); Veronica Strong, Hillsboro, OR (US); Aleksandar Aleksov, Chandler, AZ (US); Brandon Rawlings, Chandler, AZ (US); Neelam Prabhu Gaunkar, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 395 days.

(21) Appl. No.: 17/561,570

(22) Filed: Dec. 23, 2021

(65) Prior Publication Data

US 2023/0207404 A1 Jun. 29, 2023

(51) Int. Cl.
| | |
|---|---|
| *H10W 70/685* | (2026.01) |
| *H10W 20/20* | (2026.01) |
| *H10W 70/05* | (2026.01) |
| *H10W 70/63* | (2026.01) |
| *H10W 70/692* | (2026.01) |
| *H05K 1/03* | (2006.01) |

(52) U.S. Cl.
CPC ......... *H10W 70/692* (2026.01); *H10W 20/20* (2026.01); *H10W 70/095* (2026.01); *H10W 70/635* (2026.01); *H05K 1/0306* (2013.01)

(58) Field of Classification Search
CPC ..... H01L 23/15; H01L 21/486; H01L 23/481; H01L 23/49827; H01L 23/49822; H05K 1/0306; H05K 1/165; H10W 70/692; H10W 70/095; H10W 70/635; H10W 70/685; H10W 20/20
See application file for complete search history.

(56) References Cited

U.S. PATENT DOCUMENTS

| | | | |
|---|---|---|---|
| 2009/0117325 A1 | 5/2009 | Gardner | |
| 2009/0273428 A1 | 11/2009 | Chen | |
| 2015/0061084 A1* | 3/2015 | Tsai .................... | H10H 20/819 |
| | | | 257/621 |

(Continued)

FOREIGN PATENT DOCUMENTS

| | | | |
|---|---|---|---|
| JP | 2011037707 | | 2/2011 |
| JP | 2011037707 A | * | 2/2011 |

OTHER PUBLICATIONS

Journal of Crystal Growth & Design, 2019, 19, 2189-2205 (Year: 2019).*

(Continued)

*Primary Examiner* — Dale E Page
*Assistant Examiner* — Cristian A Tivarus
(74) *Attorney, Agent, or Firm* — Schwabe, Williamson & Wyatt P.C.

(57) ABSTRACT

Embodiments disclosed herein include electronic packages. In an embodiment, an electronic package comprises a substrate, where the substrate comprises glass. In an embodiment, a via opening is formed through the substrate, where the via opening has an hourglass shaped profile. In an embodiment, a magnetic layer fills the via opening, and a via is through the magnetic layer. In an embodiment, sidewalls of the via are substantially vertical.

18 Claims, 33 Drawing Sheets

(56)     References Cited

U.S. PATENT DOCUMENTS

| | | | |
|---|---|---|---|
| 2015/0277047 A1* | 10/2015 | Flemming | G02B 6/136 |
| | | | 216/26 |
| 2015/0371772 A1 | 12/2015 | Jou | |
| 2016/0135289 A1* | 5/2016 | Cho | H05K 1/0271 |
| | | | 174/251 |
| 2017/0140862 A1* | 5/2017 | Yun | H01F 41/042 |
| 2019/0206780 A1* | 7/2019 | Chatterjee | H01L 23/49816 |
| 2019/0287815 A1* | 9/2019 | Xu | H01F 41/24 |
| 2019/0304912 A1* | 10/2019 | Ecton | H01L 23/5386 |
| 2021/0104475 A1 | 4/2021 | Radhakrishnan | |
| 2021/0159160 A1 | 5/2021 | Chen | |
| 2021/0183562 A1* | 6/2021 | Kawai | H01F 17/06 |
| 2024/0145321 A1* | 5/2024 | Che | H01F 17/0013 |

OTHER PUBLICATIONS

Cao et al., Journal of Crystal Growth & Design, 2019, 19, 2189-2205 (Year: 2019).*

Extended European Search Report for European Patent No. 22208283.6 mailed May 15, 2023, 9 pgs.

Office Action for U.S. Appl. No. 17/561,559 mailed Apr. 25, 2025, 18 pgs.

Final Office Action for U.S. Appl. No. 17/561,559 mailed Sep. 30, 2025, 20 pgs.

Office Action for U.S. Appl. No. 17/561,578 mailed Jul. 3, 2025, 12 pgs.

* cited by examiner

COAXIAL INDUCTORS FABRICATED THROUGH A DRILL-LESS VIA PROCESS

TECHNICAL FIELD

Embodiments of the present disclosure relate to electronic packages, and more particularly to electronic packages with coaxial inductors in glass cores.

BACKGROUND

Inductors are increasingly crucial to high performance, fast and clean (low noise) power delivery to the die. As dies become more power hungry and power regulators (i.e., voltage regulators) get closer and closer to the die to decrease any losses or parasitic elements, power inductors integrated in the package substrate gain increasing importance for electronic packages. One such inductor architecture uses a magnetic material that is paste printed and cured. Via openings are then drilled into the cured magnetic material. However, the cured magnetic material is usually very hard. This leads to the need to replace drill bit often (which increases costs). The replacement of drill bits also reduces throughput. Furthermore, since each inductor needs to be drilled separately, it takes a long time to make all of the via openings for an electronic package.

EMBODIMENTS OF THE PRESENT DISCLOSURE

Figure 1A:
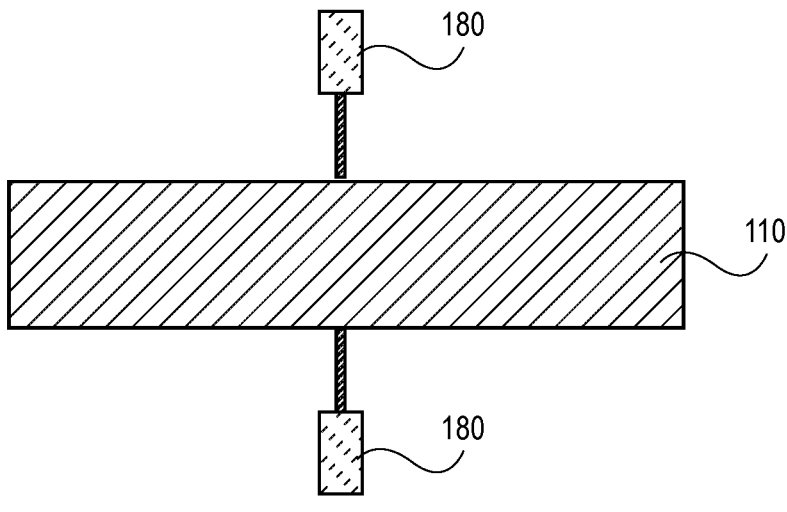
FIGS. 1A-1C are cross-sectional illustrations depicting a process for forming a via opening through a glass core with a laser-assisted etching process, in accordance with an embodiment.

Described herein are electronic packages with coaxial inductors in glass cores, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, inductors are increasingly crucial to high performance, fast and clean (low noise) power delivery to the die. However, existing inductor architectures are limited. For example, first openings are created through the core with a first drilling process. A magnetic paste is then disposed in the first opening and cured. The magnetic paste material is often an organic matrix filled with magnetic particles. Then the magnetic paste material is drilled with a smaller radius drill bit. A conductive plated through hole (PTH) is then deposited to line the smaller opening. The PTH is filled with a plugging material (e.g., an organic fill).

However, the magnetic paste material typically has a low permeability, thus lowering the available inductance. In addition, due to this low permeability, the magnetic volume must be increased to allow for reaching the necessary inductivity. In a particular instance, for a paste with a permeability projected at 25, the outer drill bit is 350 µm and the inner drill bit is 150 µm. This results in a magnetic material thickness of 100 µm around the conformally plated conductor of the PTH. As such, a single inductor loop made from two inductors at a pitch of 550 µm would require approximately 0.6 mm² of area. This limits the number of inductors that can be placed in the core area as it continually shrinks with each process node. Accordingly, the limitation on reducing drill bit diameters further limits the scaling of such devices.

Additionally, existing inductor architectures are limited in that they are time consuming to produce due to the mechanical drilling through the hard magnetic material. The hard magnetic material may also result in the frequent need to replace drill bits, which further reduces throughput.

Accordingly, embodiments disclosed herein include inductor architectures that are fabricated in glass cores. The vertical holes in which the inductors are fabricated are formed with a laser-assisted etching process. The laser-assisted etching process results in the ability to scale the inductors to smaller dimensions and pitches, and use materials with improved permeabilities. As such, more inductors, and inductors with higher inductivities are provided.

In one embodiment, a high permeability and high resistivity magnetic material is plated on the surface of a via opening through a glass core. The thickness of the magnetic inductor material is required to be small enough so that eddy current generation is sufficiently suppressed. The higher the metal resistivity the thicker the deposited layer of magnetic material can be. If the total volume of the magnetic material would necessitate a thickness larger than the one that would lead to eddy-currents in the magnetic material, then several laminations or layers separated by thin electrically insulating layers can be deposited.

The high permeability allows for a small magnetic volume to reach the required inductance and hence thin magnetic layers. For example, in conjunction with laser-assisted etching processes, embodiments disclosed herein can produce two inductors that can occupy as little as approximately 0.06 mm². As such, improvements of up to approximately 10× the amount of inductors per unit area may be provided when embodiments disclosed herein are used.

In yet another embodiment, manufacturing processes allow for the parallel fabrication of a plurality of inductors without the need for mechanical drilling. For example, the inductor opening may be fabricated with a laser-assisted etching process. After the opening is formed, a template structure is inserted into the opening. The magnetic material may then be disposed around the template structure. The template structure can then be removed to provide a hole through the magnetic material in which the conductor can be deposited. The template structure may be melted, etched, mechanically removed, or the like.

In yet another embodiment, separate holes are created for the metallized via and the magnetic material. The holes may be fabricated with a laser-assisted etching process. Due to the capabilities of laser-assisted etching, the distance between the metallized holes and the magnetic material holes can be reduced (e.g., down to approximately 5 µm). As such, high inductances and inductor density is enabled. Additionally, mechanical drilling is avoided, which leads to time and cost savings. Particularly, time is saved because all of the vias on the panel or wafer can be processed simultaneously. Such an embodiment also enables potential wideband regulators using coupled buck topologies.

Figure 1B:
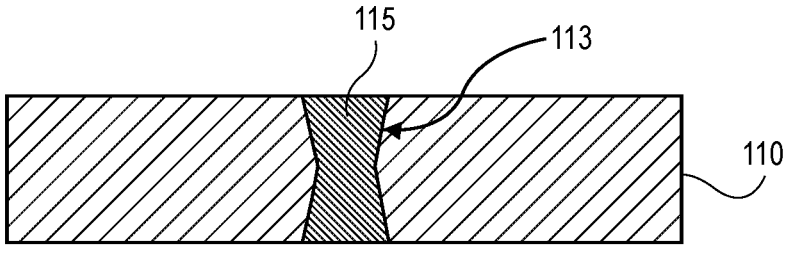
Figure 1C:
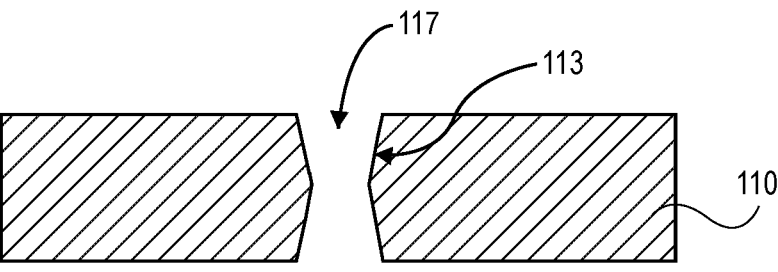
Figure 2A:
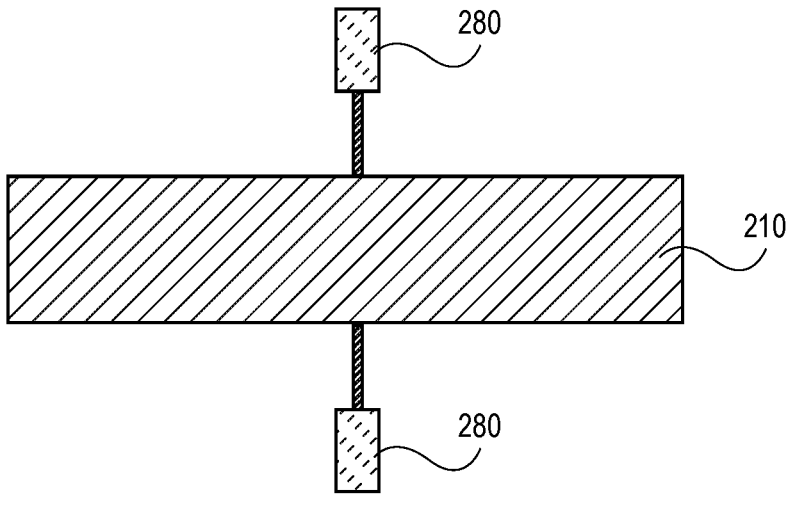
FIGS. 2A-2C are cross-sectional illustrations depicting a process for forming blind via openings into a glass core with a laser-assisted etching process, in accordance with an embodiment.
Figure 2B:
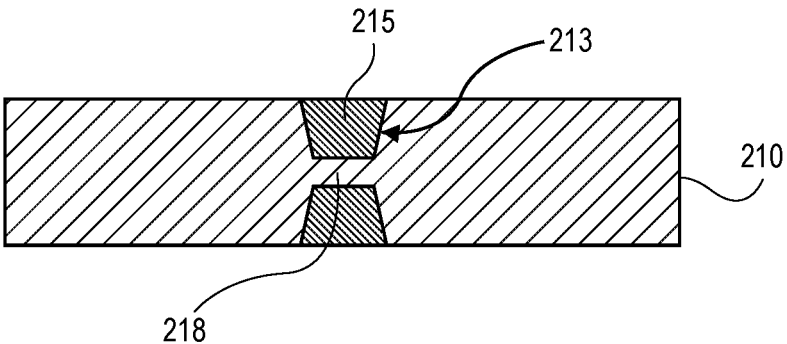
Figure 2C:
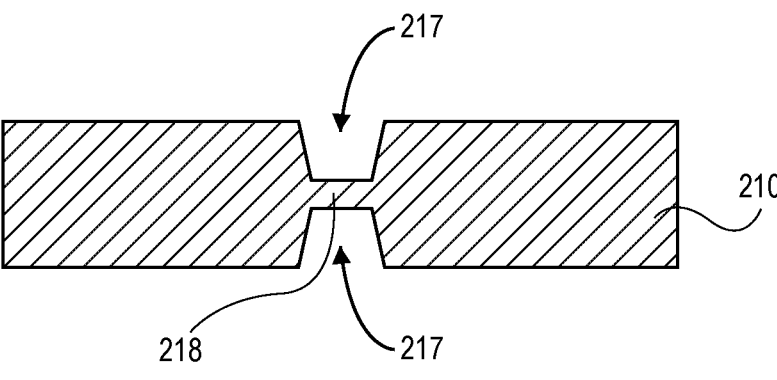
Figure 3A:
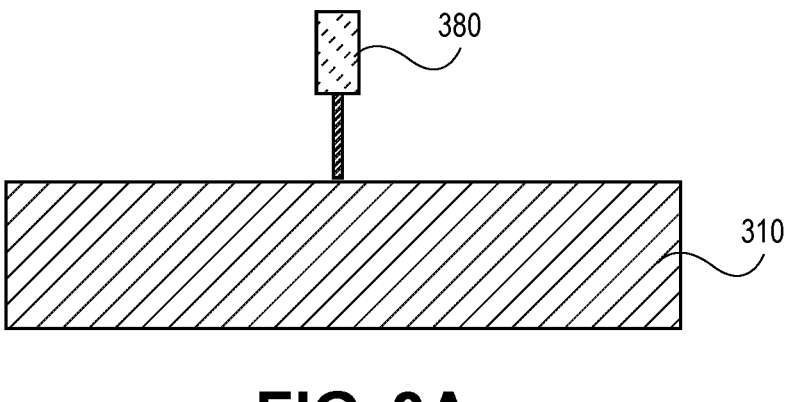
FIGS. 3A-3C are cross-sectional illustrations depicting a process for forming a blind via opening into a glass core with a laser-assisted etching process, in accordance with an embodiment.
Figure 3B:
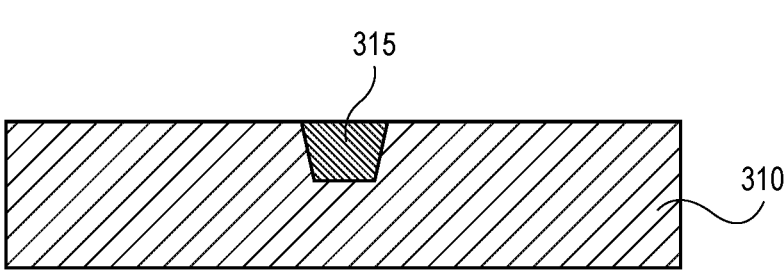
Figure 3C:
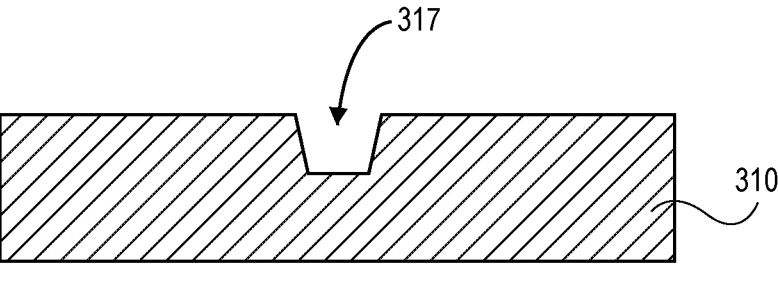

Referring now to FIGS. 1A-3C, three series of cross-sectional illustrations that depict processes for forming features in glass cores with laser-assisted etching processes are shown, in accordance with an embodiment. One or more of the laser-assisted etching processes shown in FIGS. 1A-1C may be used in order to fabricate inductor structures in glass cores, in accordance with embodiments disclosed herein. In FIGS. 1A-1C, a through core via opening is formed. In FIGS. 2A-2C a pair of blind via openings on opposite surfaces of the core are formed. In FIGS. 3A-3C a blind via opening into the top surface of the core is formed. The openings formed in FIGS. 1A-3C can then be filled with materials (e.g., conductive materials) using various plating or other deposition processes.

Referring now to FIGS. 1A-1C, a series of cross-sectional illustrations depicting a process for fabricating openings in a glass core 110 is shown, in accordance with an embodiment.

Referring now to FIG. 1A, a cross-sectional illustration of a glass core 110 is shown, in accordance with an embodiment. In an embodiment, the glass core 110 may have a thickness that is between approximately 50 μm and approximately 1,000 μm. As used herein, approximately may refer to a value that is within 10% of the stated value. For example, approximately 100 μm may refer to a range between 90 μm and 110 μm. Though, it is to be appreciated that other thicknesses (larger or smaller) may also be used for the glass core 110. In an embodiment, a laser 180 is used to expose a region of the glass core 110. As shown in FIG. 1A, the exposure may be made on both sides (i.e., the top surface of the glass core 110 and the bottom surface of the glass core 110). A single laser 180 may be used, or multiple lasers may be used. In an embodiment, the laser 180 is exposed over the glass core 110 at locations where via openings are desired.

Referring now to FIG. 1B, a cross-sectional illustration of the glass core 110 after the laser 180 exposure is completed is shown, in accordance with an embodiment. As shown, the laser 180 exposure may result in the formation of exposed regions 115. In an embodiment, the glass core 110 may comprise a glass material that is able to be morphologically changed upon exposure to a laser 180. For example, the morphological change may result in the microstructure of the glass core 110 transforming to a crystalline structure from an amorphous structure. Accordingly, the exposed region 115 is shown with a different shading than the glass core 110.

In an embodiment, the laser 180 exposure may result in an exposed region 115 that has a tapered sidewall 113. In the instance where both sides of the glass core 110 are exposed (as is the case shown in FIG. 1A), the exposed region 115 may have a double tapered profile. That is, widths of the exposed region 115 at a top surface of the glass core 110 and at a bottom surface of the glass core 110 may be wider than a width at a middle of the glass core 110. In some instances, such a sidewall 113 profile may be referred to as an hourglass shaped profile.

Referring now to FIG. 1C, a cross-sectional illustration of the glass core 110 after the exposed region 115 is removed is shown, in accordance with an embodiment. In an embodiment, removal of the exposed region 115 may result in the formation of a via opening 117. The via opening 117 may pass entirely through a thickness of the glass core 110. In an embodiment, the via opening 117 may be a high aspect ratio via opening 117. As used herein a "high aspect ratio" may refer to an aspect ratio (depth:width) that is approximately 5:1 or greater, with the width being measured at a narrowest point through a thickness of the via opening 117. In other embodiments, the aspect ratio of the via opening 117 may be approximately 10:1 or greater, approximately 20:1 or greater, or approximately 50:1 or greater.

Referring now to FIGS. 2A-2C, a series of cross-sectional illustrations depicting a process for forming blind structures into a glass core 210 is shown, in accordance with an embodiment. Instead of forming an opening entirely through the glass core 210, structures that extend partially through a thickness of the core 210 are provided.

Referring now to FIG. 2A, a cross-sectional illustration of a glass core 210 is shown, in accordance with an embodiment. In an embodiment, the glass core 210 may be substantially similar to the glass core 110 described in greater detail above. For example, the glass core 210 may have a thickness between approximately 50 μm and approximately 1,000 μm. In an embodiment, lasers 280 may expose portions of the glass core 210. In an embodiment, the laser 280 exposure in FIG. 2A may be different than the laser 180 exposure in FIG. 1A. For example, an intensity or duration of the laser 280 exposure may be less than the intensity or duration of the laser 180 exposure in FIG. 1A.

Referring now to FIG. 2B, a cross-sectional illustration of the glass core 210 after exposed regions 215 are formed is shown, in accordance with an embodiment. In an embodiment, the exposed regions 215 do not extend entirely through a thickness of the glass core 210. For example, a region 218 may be provided between the top exposed region 215 and the bottom exposed region 215. In some instances, the exposed regions 215 still include tapered sidewalls 213. Since the exposed regions 215 are formed from only a single side, the sidewalls 213 may only have a single taper. That is, the exposed regions 215 may not be hourglass shaped.

Referring now to FIG. 2C, a cross-sectional illustration of the glass core 210 after the exposed regions 215 are removed to form openings 217 is shown, in accordance with an embodiment. In an embodiment, the exposed regions 215 may be removed with an etching process that is selective to the exposed regions 215 over the rest of the glass core 210. As shown, the openings 217 do not extend entirely through the glass core 210. In such embodiments, the openings 217 may be referred to as blind openings since they do not pass through the glass core 210.

Referring now to FIGS. 3A-3C, a series of cross-sectional illustrations depicting a process for forming a blind opening 317 is shown, in accordance with an embodiment.

Referring now to FIG. 3A, a cross-sectional illustration of a glass core 310 is shown, in accordance with an embodiment. In an embodiment, the glass core 310 may be substantially similar to the glass cores 110 and 210 described in greater detail above. For example, the glass core 310 may have a thickness between approximately 50 μm and approximately 1,000 μm. In an embodiment, a laser 380 may be used to expose a surface of the glass core 310. In contrast to embodiments described in greater detail above, the laser 380 exposure may only be provided on a single surface of the glass core 310.

Referring now to FIG. 3B, a cross-sectional illustration of the glass core 310 after the laser exposure to form an exposed region 315 is shown, in accordance with an embodiment. In an embodiment, the exposed region 315 may be a region that has a morphology change compared to the rest of the glass core 310. For example, the morphology change may be the transition from an amorphous structure to a crystalline structure. In an embodiment, the exposed region 315 may not extend entirely through a thickness of the glass core 310. That is, the exposed region 315 may be suitable for forming blind structures.

However, it is to be appreciated that in some embodiments, a laser 380 exposure on a single surface of the glass core 310 can be used to form an exposed region 315 that extends through an entire thickness of the glass core 310. That is, it is not necessary to use an exposure on both sides of the glass core 310 in order to form through core structures. In such an embodiment, the sidewall profile of the exposed region 315 may have a single taper, instead of the hour-glass shaped taper shown in FIG. 1B.

Referring now to FIG. 3C, a cross-sectional illustration of the glass core 310 after the exposed region 315 is removed is shown, in accordance with an embodiment. In an embodiment, the removal of the exposed region 315 may result in an opening 317 being formed into the surface of the glass core 310. In an embodiment, the opening 317 may be a blind opening. In other embodiments, the opening 317 may pass entirely through a thickness of the glass core 310.

Figure 4A:
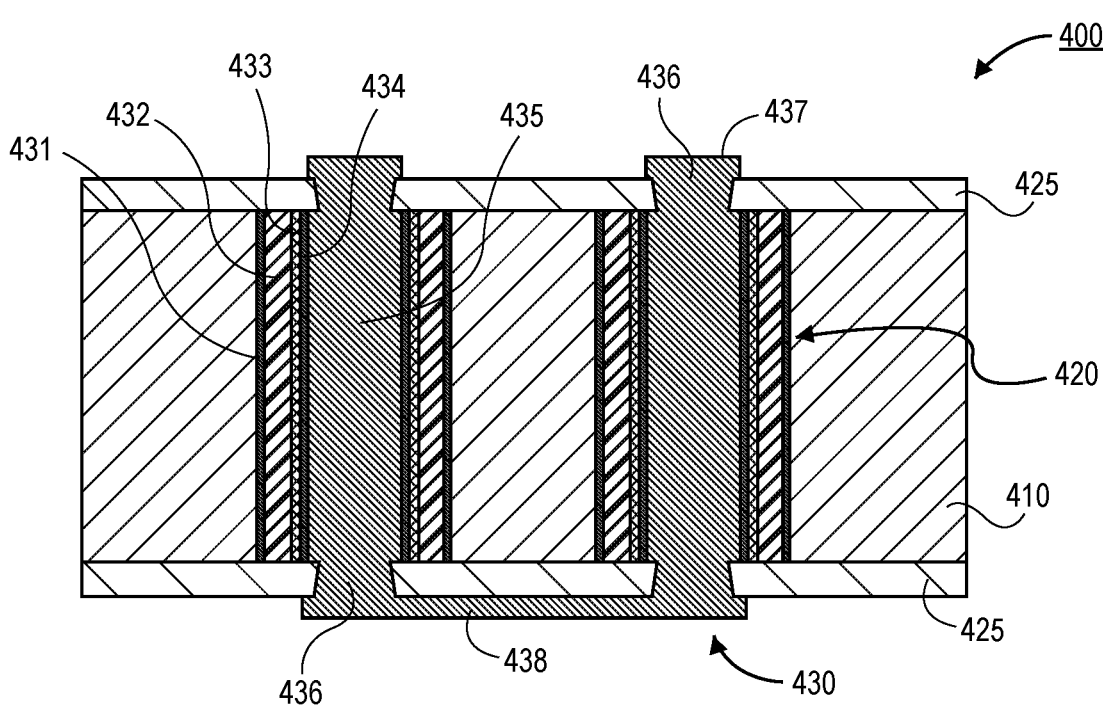
FIG. 4A is a cross-sectional illustration of an inductor loop with a pair of vertically oriented inductors with a singled magnetic layer, in accordance with an embodiment.

Referring now to FIG. 4A, a cross-sectional illustration of an electronic package 400 is shown, in accordance with an embodiment. In an embodiment, the electronic package 400 may comprise a core 410. The core 410 may be a glass core or the like. In an embodiment, the core 410 may have a thickness between approximately 50 μm and approximately 1,000 μm. One or more dielectric buildup layers 425 may be provided above and/or below the core 410.

In an embodiment, the electronic package 400 may include an inductor loop 430. Particularly, the inductor loop 430 may comprise a pair of inductors 420. The inductors 420 may be coupled to each other in series by a trace 438 provided over a buildup layer 425. Vias 436 may pass through the buildup layer 425 in order to connect the via 435 of the inductors 420 to the trace 438. On the opposite end of the via 435, vias 436 may couple the via 435 to pads 437 over a buildup layer 425.

In an embodiment, each of the inductors 420 may be formed in via openings formed through the core 410. A first seed layer 431 may be in direct contact with the sidewalls of the via opening through the core 410. In some instances an adhesion layer (not shown) may be provided between the core 410 and the seed layer 431. For example, the adhesion layer may comprise silicon and nitrogen, tantalum and nitrogen, titanium and nickel, or the like. In an embodiment, the seed layer 431 may comprise titanium and copper, tantalum and copper, ruthenium and copper, or only copper. A thickness of the seed layer 431 may be between approximately 10 nm and approximately 300 nm. In an embodiment, the seed layer 431 may be deposited with an atomic layer deposition (ALD) process, a chemical vapor deposition (CVD) process, a physical vapor deposition (PVD) process, an electroless plating process, or the like.

In an embodiment, a magnetic layer 432 is then plated over the seed layer 431. The magnetic layer 432 may be plated to a thickness as large as possible before losses induced by eddy currents develop. The thickness of the magnetic layer 432 may be dictated by the resistance of the magnetic layer 432, with higher resistances allowing for greater thicknesses. Hence, the thickness of the magnetic layer 432 will vary depending on the composition of the magnetic layer 432. For example, the thickness of the magnetic layer 432 may be between approximately 500 nm and approximately 10 μm. The magnetic layer 432 may be formed with a plating process, such as an electroplating process. In an embodiment, the magnetic layer may comprise a high $\mu_r$ material, such as, but not limited to PZT, CoNiFeX, where X is O, S, P, B, or any combination thereof.

In an embodiment, an insulating layer 433 is provided over the magnetic layer 432 in order to prevent shorts between the via 435 and the magnetic layer 432. A thickness of the insulating layer 433 should be as small as possible in order to minimize the effect of the insulating layer 433 on the inductance of the inductor 420. For example, the insulating layer 433 may be between approximately 10 nm and approximately 5 μm. In an embodiment, the insulating layer 433 may be deposited with an ALD process, a CVD process, or a PVD process. The insulating layer 433 may comprise silicon and oxygen, silicon and nitrogen, aluminum and oxygen, or the like. The insulating layer 433 may also be used as an adhesion layer for the subsequently deposited second seed layer 434.

In an embodiment, the second seed layer 434 may be deposited over the insulating layer 433. The second seed layer 434 may comprise titanium and copper, tantalum and copper, ruthenium and copper, or only copper. The second seed layer 434 may be substantially similar to the first seed layer 431 described above. In the instance where the seed layer 434 is copper, there may not be a discernable seed layer when the via 435 is also copper. A thickness of the second seed layer 434 may be between approximately 10 nm and approximately 300 nm. The second seed layer 434 may be deposited with an electroless plating process, an ALD process, a CVD process, a PVD process, or the like.

In an embodiment, the via 435 is disposed over the second seed layer 434. The via 435 may comprise copper or the like. In an embodiment, the diameter of the via 435 may have a diameter between approximately 20 μm and approximately 100 μm in order to achieve a low DC resistance required for a high-quality inductor. In contrast to existing inductor topologies, the via 435 may fully fill the remainder of the opening through the core 410. That is, there is no need for a plugging material in some embodiments.

In yet another embodiment, the insulating layer 433 may be omitted when the resistivity of the magnetic layer 432 is sufficiently high. For example, when the resistivity of the magnetic layer 432 is approximately 250 times the resistivity of the via 435, then the insulating layer 433 may be omitted. The elimination of the insulating layer 433 is possible, because the higher resistivity (and small thickness) of the magnetic layer 432 results in very little current passing through the magnetic layer 432. Additionally, removal of the insulating layer 433 may allow for the second seed layer 434 to be eliminated as well. As such, the manufacturing complexity can be reduced by eliminating one or more layers.

Figure 4B:
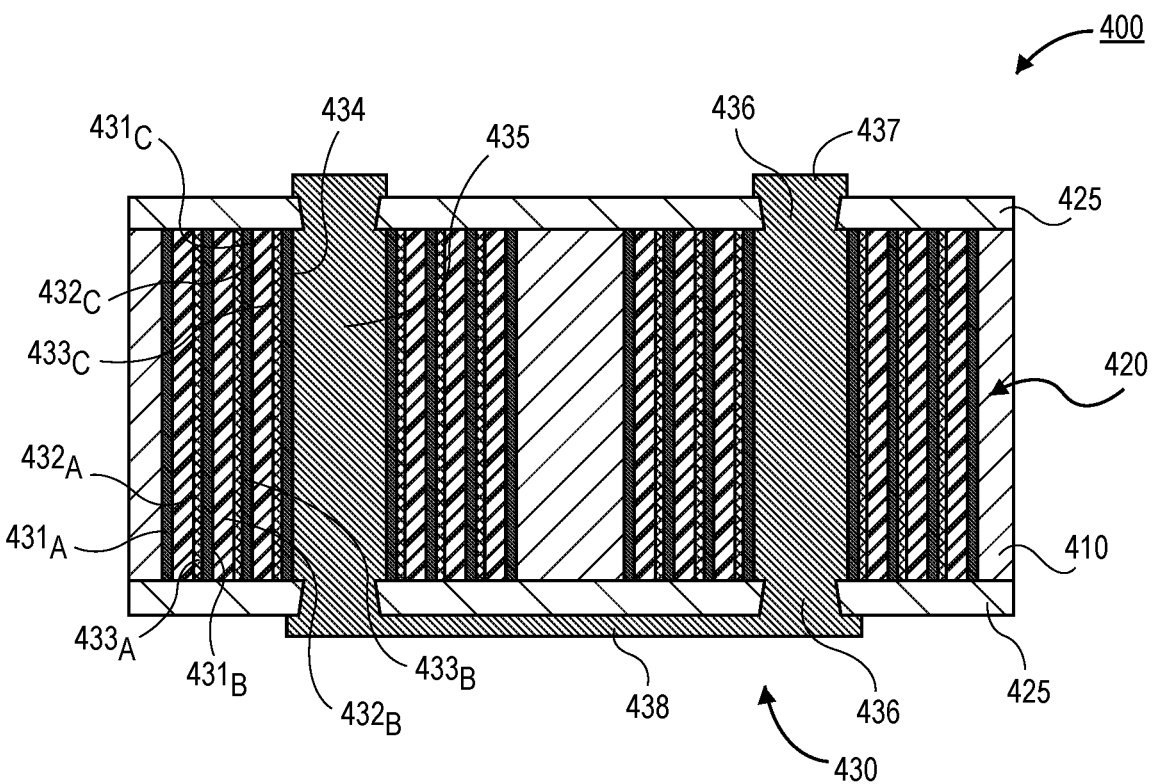
FIG. 4B is a cross-sectional illustration of an inductor loop with a pair of vertically oriented inductors with a plurality of magnetic layers, in accordance with an embodiment.

Referring now to FIG. 4B, a cross-sectional illustration of an electronic package 400 is shown, in accordance with an additional embodiment. The electronic package 400 in FIG. 4B may be substantially similar to the electronic package 400 in FIG. 4A, with the exception of the formation of the magnetic layers. As noted above, the thickness of the magnetic layer 432 is limited by the formation of eddy currents which increase the losses in the inductor. Accordingly, embodiments include a plurality of laminations or layers of magnetic layers 432. For example, as shown in FIG. 4B, three magnetic layers 432A-c are provided. In an embodiment, each layer may comprise a seed layer 431A-c, a magnetic layer 432A-c over the seed layer 431A-c, and an insulating layer 433A-c over the magnetic layer. After the desired number of laminations are formed, a second seed layer 434 is provided and the via 435 is provided over the second seed layer 434. As such, the volume of magnetic material can be increased without suffering losses due to eddy currents in the magnetic layers 432. Similar to above, the last insulating layer 433 may be omitted when the resistivity of the magnetic layer 432 is sufficiently high compared to the via 435 (e.g., when the magnetic layer 432 has a resistivity 250 times greater than that of the via 435).

Referring now to FIGS. 5A-5I, a series of cross-sectional illustrations depicting a process for forming an electronic package 500 with inductor loops 530 is shown, in accordance with an embodiment.

Figure 5A:
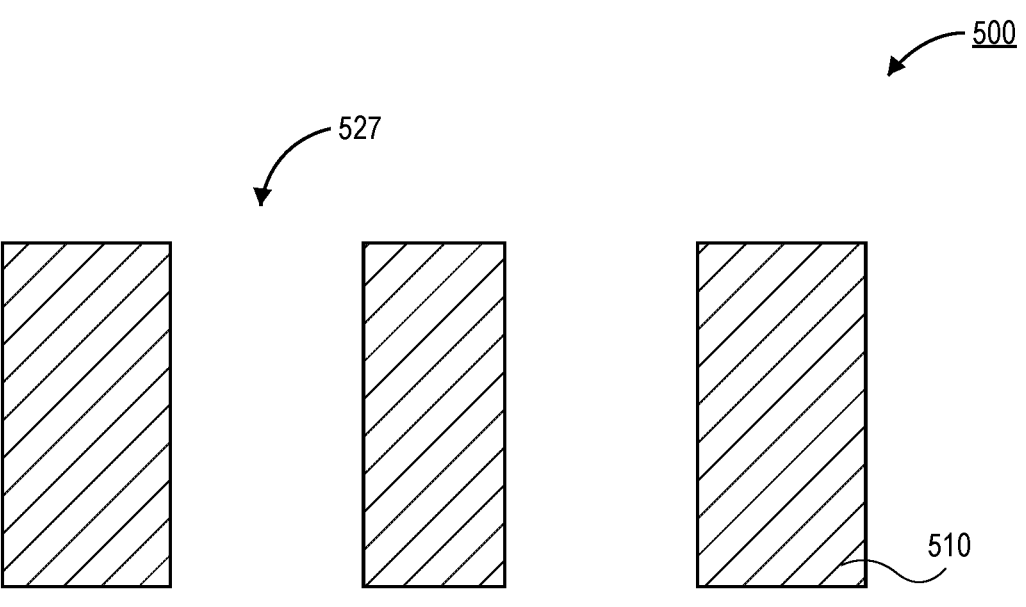
FIGS. 5A-5I are a series of cross-sectional illustrations depicting a process for forming an inductor loop, in accordance with an embodiment.

Referring now to FIG. 5A, a cross-sectional illustration of a core 510 is shown, in accordance with an embodiment. In an embodiment, the core 510 may be a glass core. In an embodiment, the core 510 may be patterned to form a pair of openings 527 through a thickness of the core 510. In an embodiment, the openings 527 may be formed with a laser-assisted etching process, such as those described in greater detail above. In the illustrated embodiment, the openings 527 are shown with substantially vertical sidewalls. However, it is to be appreciated that the sidewalls of the openings 527 may be tapered or hourglass shaped similar to embodiments described above.

Figure 5B:
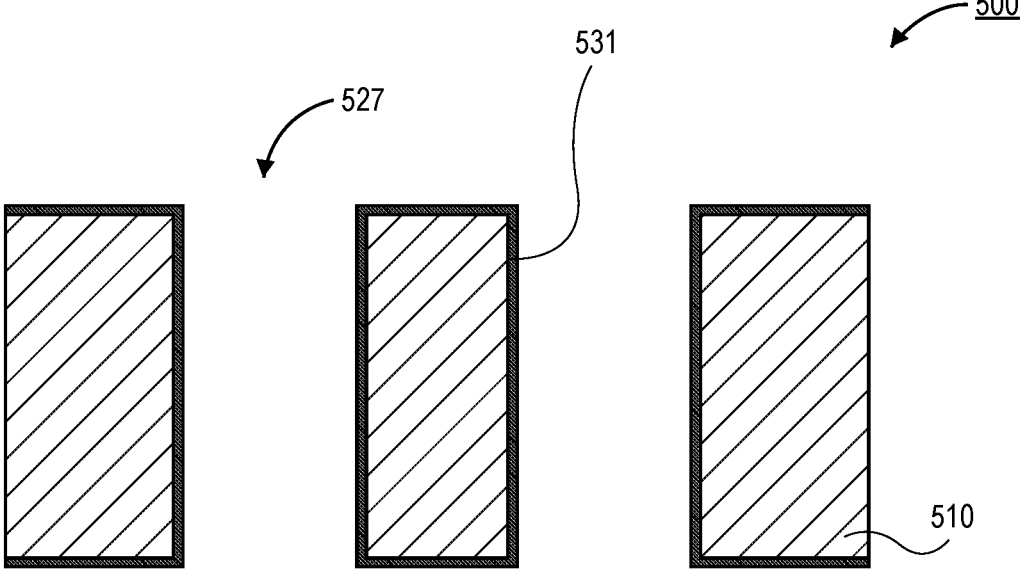

Referring now to FIG. 5B, a cross-sectional illustration of the electronic package 500 after the formation of the first seed layer 531 is deposited is shown, in accordance with an embodiment. In an embodiment, the first seed layer 531 may be deposited over sidewall surfaces of the openings 527 and over a top surface and a bottom surface of the core. In an embodiment, the first seed layer 531 may comprise titanium and copper, tantalum and copper, ruthenium and copper, or only copper. A thickness of the first seed layer 531 may be between approximately 10 nm and approximately 300 nm. In an embodiment, the first seed layer 531 may be deposited with an ALD process, a CVD process, a PVD process, an electroless plating process, or the like. In some instances an adhesion layer (not shown) may be provided between the core 510 and the seed layer 531. For example, the adhesion layer may comprise silicon and nitrogen, tantalum and nitrogen, titanium and nickel, or the like.

Figure 5C:
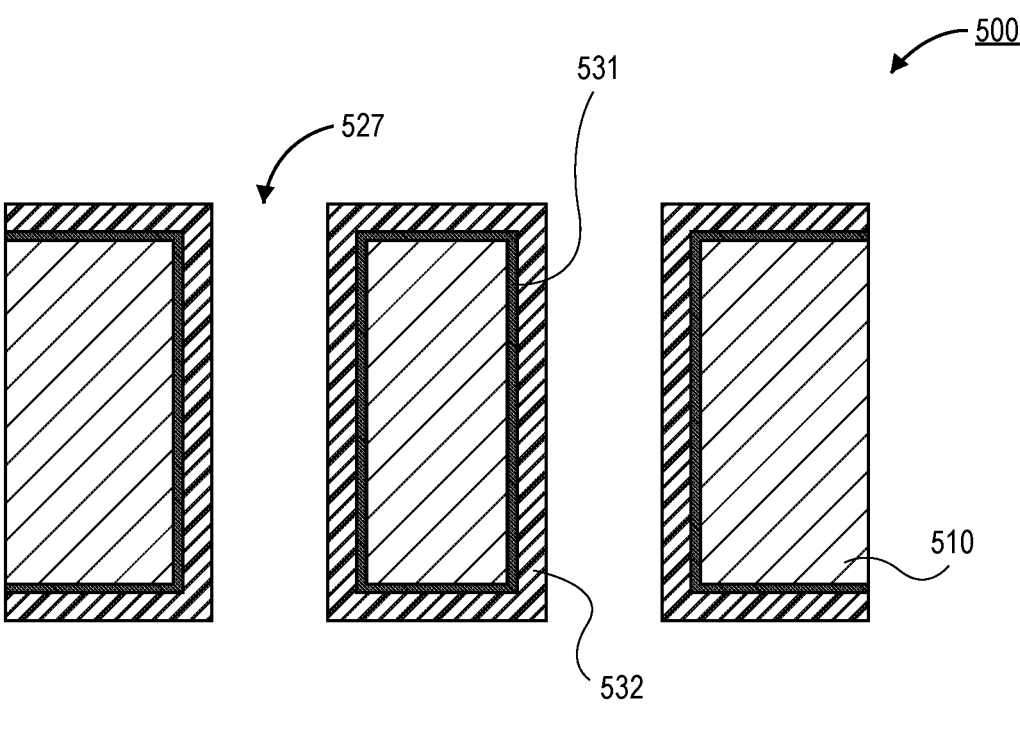

Referring now to FIG. 5C, a cross-sectional illustration of the electronic package 500 after a magnetic layer 532 is formed is shown, in accordance with an embodiment. The magnetic layer 532 may be deposited over sidewalls of the openings 527 and over the top and bottom surface of the core 510. The magnetic layer 532 may be plated to a thickness as large as possible before losses induced by eddy currents develop. The thickness of the magnetic layer 532 may be dictated by the resistance of the magnetic layer 532, with higher resistances allowing for greater thicknesses. Hence, the thickness of the magnetic layer 532 will vary depending on the composition of the magnetic layer 532. For example, the thickness of the magnetic layer 532 may be between approximately 500 nm and approximately 10 μm. The magnetic layer 532 may be formed with a plating process, such as an electroplating process. In an embodiment, the magnetic layer 532 may comprise a high $\mu_r$ material, such as, but not limited to PZT, CoNiFeX, where X is O, S, P, B, or any combination thereof.

Figure 5D:
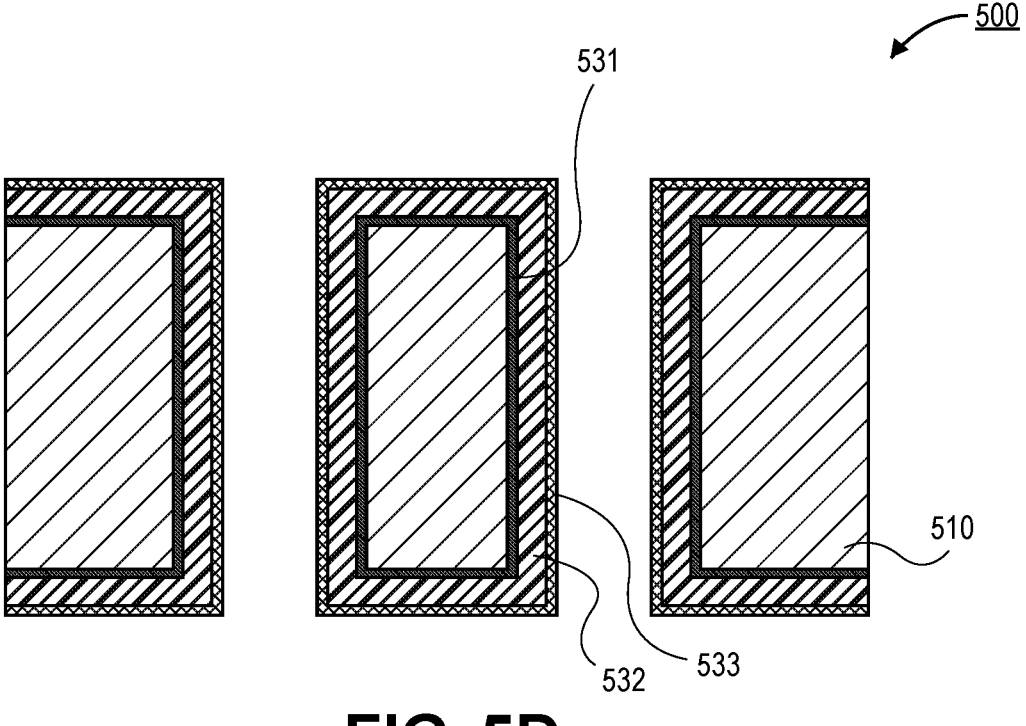

Referring now to FIG. 5D, a cross-sectional illustration of the electronic package 500 after an insulating layer 533 is deposited is shown, in accordance with an embodiment. In an embodiment, the insulating layer 533 may be deposited over the sidewalls of the openings 527 and the top and bottom surfaces of the core 510. A thickness of the insulating layer 533 should be as small as possible in order to minimize the effect of the insulating layer 533 on the inductance of the inductor 520. For example, the insulating layer 533 may be between approximately 10 nm and approximately 1 μm. In an embodiment, the insulating layer 533 may be deposited with an ALD process, a CVD process, or a PVD process. The insulating layer 533 may comprise silicon and oxygen, silicon and nitrogen, aluminum and oxygen, or the like. The insulating layer 533 may also be used as an adhesion layer for the subsequently deposited second seed layer 534. The insulating layer 533 may have a thickness between 10 nm and 5 μm.

In the embodiment shown in FIGS. 5A-5I, a single magnetic layer 532 is provided, similar to the embodiment shown in FIG. 4A. However, it is to be appreciated that substantially similar processing operations may be used to form the structure shown in FIG. 4B. Particularly, the processing operations shown in FIGS. 5B-5D may be repeated any number of times in order to provide a plurality of magnetic layers 532.

Figure 5E:
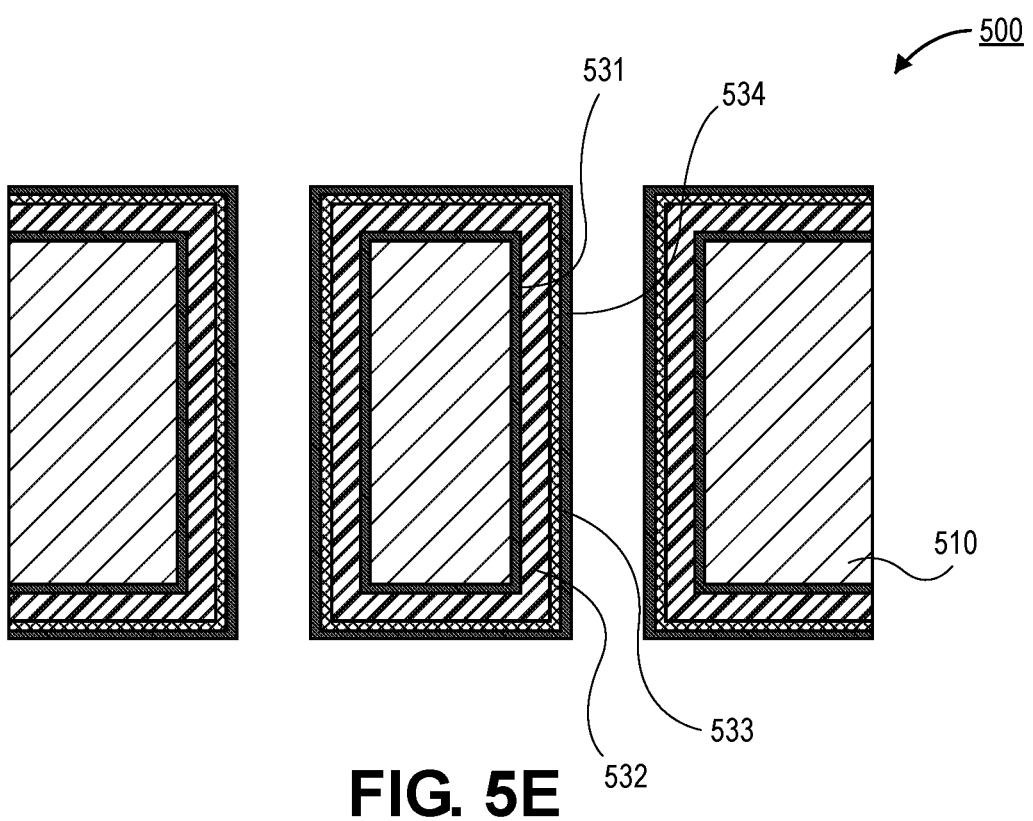

Referring now to FIG. 5E, a cross-sectional illustration of the electronic package 500 after a second seed layer 534 is deposited is shown, in accordance with an embodiment. As shown, the second seed layer 534 may be deposited over sidewalls of the openings 527 and over the top and bottom surfaces of the core 510. The second seed layer 534 may comprise titanium and copper, tantalum and copper, ruthenium and copper, or only copper. The second seed layer 534 may be substantially similar to the first seed layer 531 described above. In the instance where the seed layer 534 is copper, there may not be a discernable seed layer when the via 535 is also copper. A thickness of the seed layer 534 may be between approximately 10 nm and approximately 300 nm. The second seed layer 534 may be deposited with an electroless plating process, an ALD process, a CVD process, a PVD process, or the like.

Figure 5F:
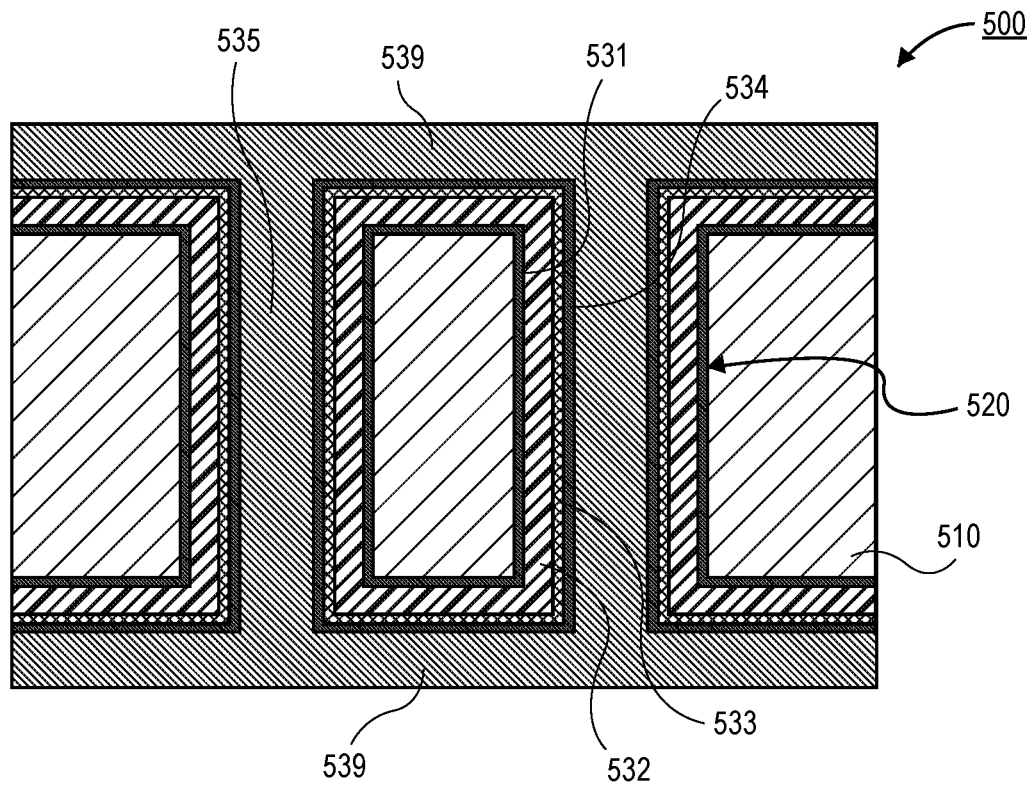

Referring now to FIG. 5F, a cross-sectional illustration of the electronic package 500 after the via 535 is formed is shown, in accordance with an embodiment. The via 535 may be formed between the sidewalls of the openings 527. Portions 539 of the via 535 may be formed over the top and bottom surfaces of the core 510. The via 535 may comprise copper or the like. In an embodiment, the diameter of the via 535 may have a diameter between approximately 20 μm and approximately 100 μm in order to achieve a low DC resistance required for a high-quality inductor. In contrast to existing inductor topologies, the via 535 may fully fill the remainder of the opening 527 through the core 510. That is, there is no need for a plugging material in some embodiments.

Figure 5G:
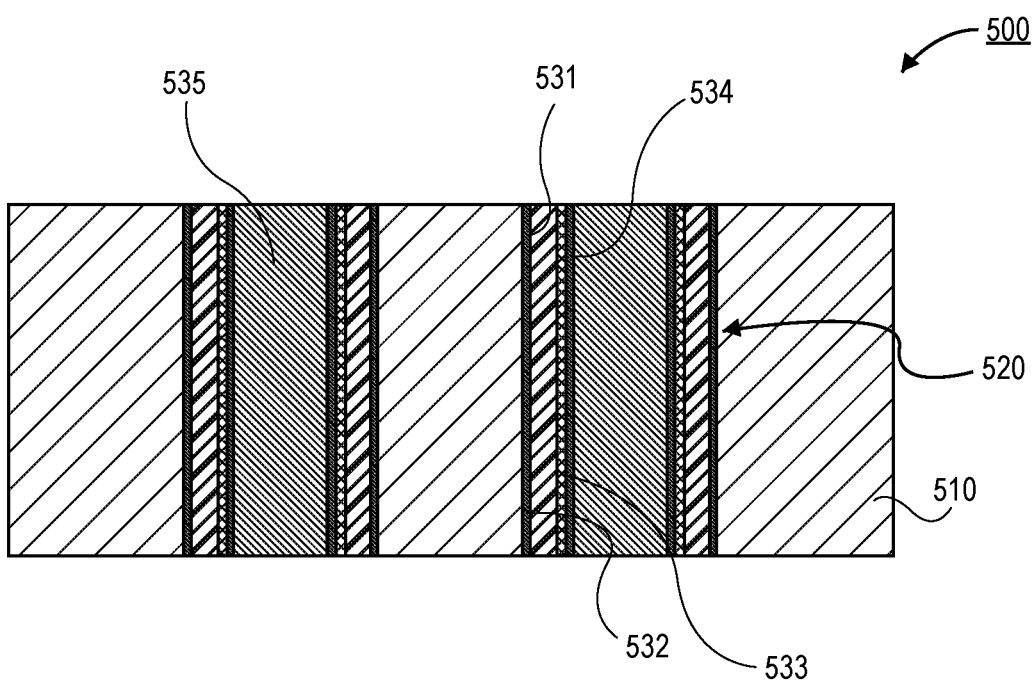

Referring now to FIG. 5G, a cross-sectional illustration of the electronic package 500 after a polishing or grinding process is shown, in accordance with an embodiment. The polishing or grinding process (e.g., chemical mechanical polishing (CMP)) may be used to remove the portions of layers 531-535 that are disposed over a top surface and bottom surface of the core 510. As such, the top surface and the bottom surface of the core 510 are exposed by the processing shown in FIG. 5G. Removing the top and bottom portions of the layers 531-535 results in the isolation of a pair of inductors 520 from each other. That is, a pair of inductors 520 that are laterally adjacent to each other are provided in FIG. 5G.

Figure 5H:
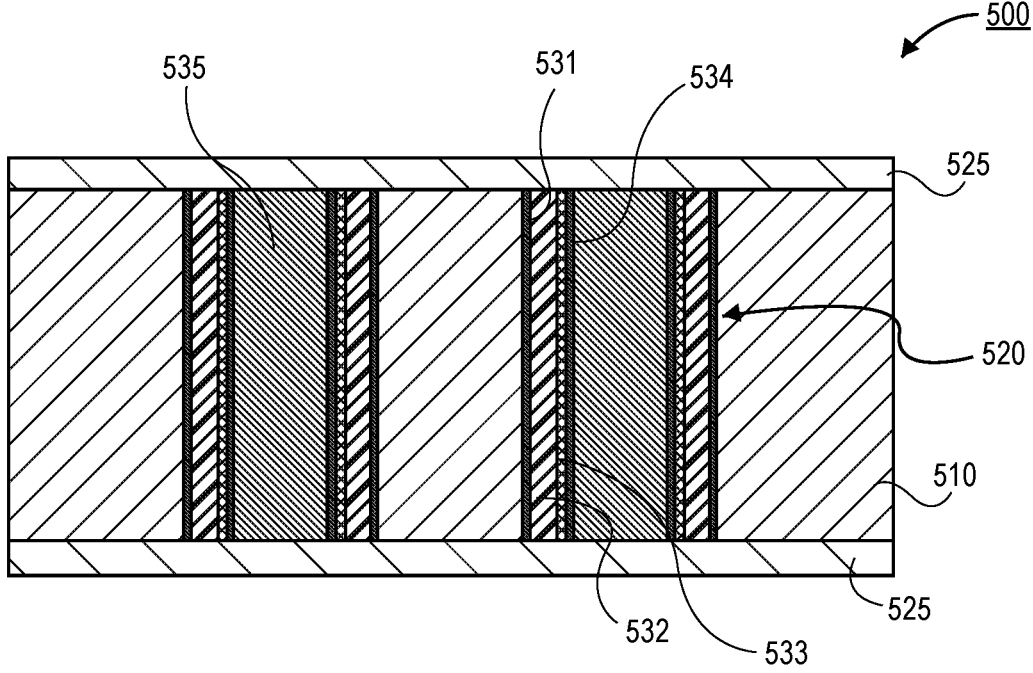

Referring now to FIG. 5H, a cross-sectional illustration of the electronic package 500 after dielectric buildup layers 525 are formed is shown, in accordance with an embodiment. As shown, buildup layers 525 may be formed over the top and/or bottom surface of the core 510. The buildup layers 525 may cover top surfaces and bottom surfaces of the inductors 520.

Figure 5I:
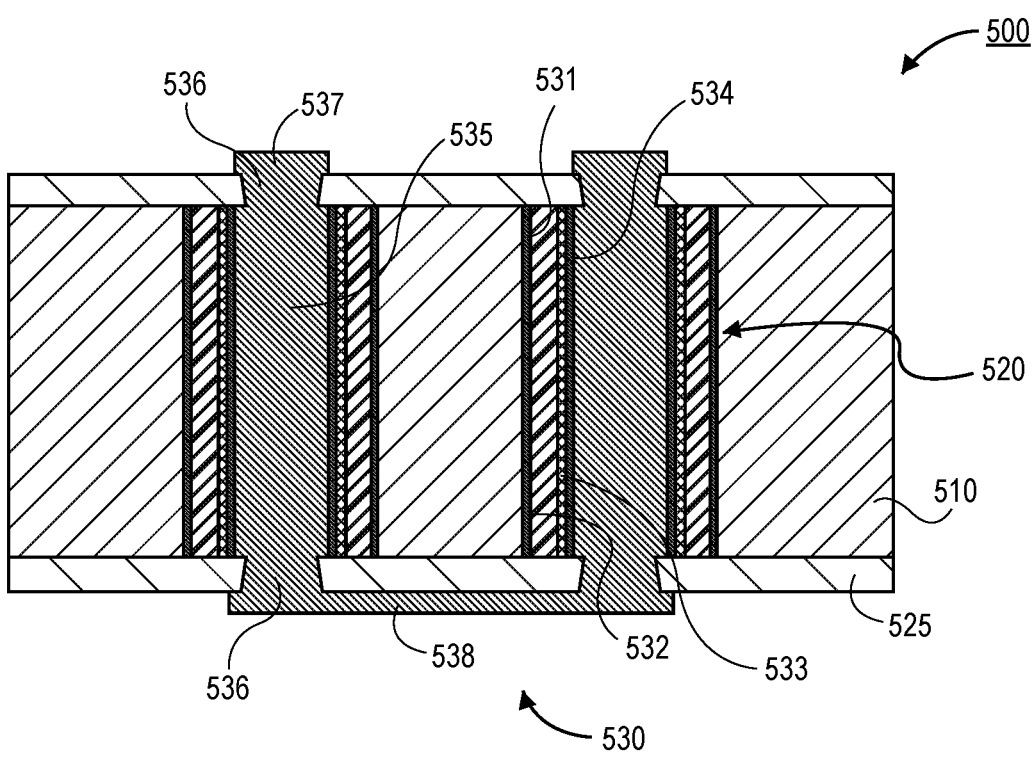

Referring now to FIG. 5I, a cross-sectional illustration of the electronic package 500 after routing is provided in the buildup layers 525 is shown, in accordance with an embodiment. In an embodiment, the routing may include vias 536 that pass through a thickness of the buildup layers 525. On the top side, the vias 536 may couple the inductors 520 to pads 537 over the buildup layers 525. On the bottom side, the vias 536 may couple the inductors 520 to a trace 538. The trace 538 may electrically couple the inductor 520 on the left to the inductor 520 on the right. As such an inductor loop 530 is provided through the core 510.

Figure 6A:
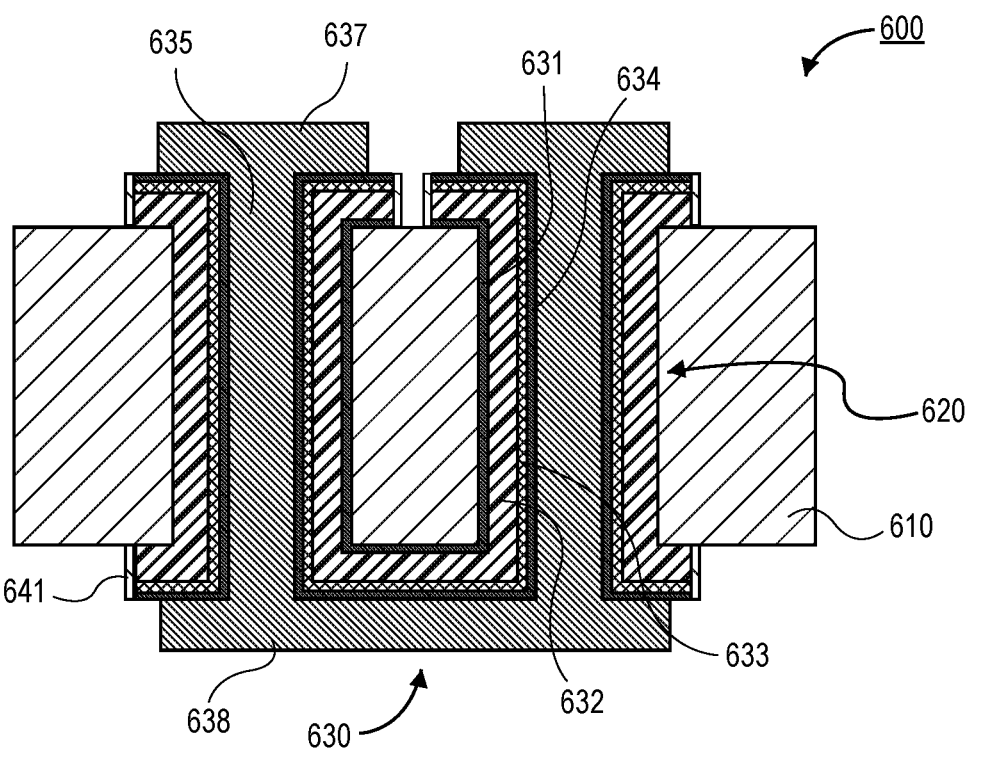
FIG. 6A is a cross-sectional illustration of an inductor loop, in accordance with an embodiment.
Figure 6B:
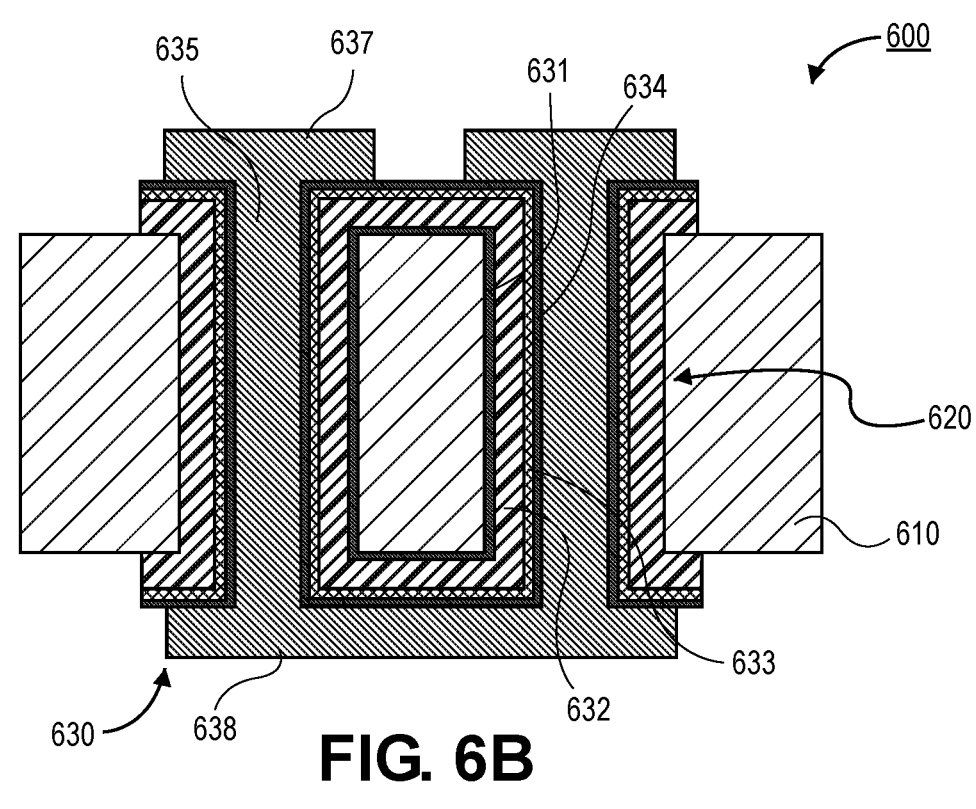
FIG. 6B is a cross-sectional illustration of an inductor loop with a continuous magnetic loop that passes through a pair of vertically oriented inductors, in accordance with an embodiment.
Figure 6C:
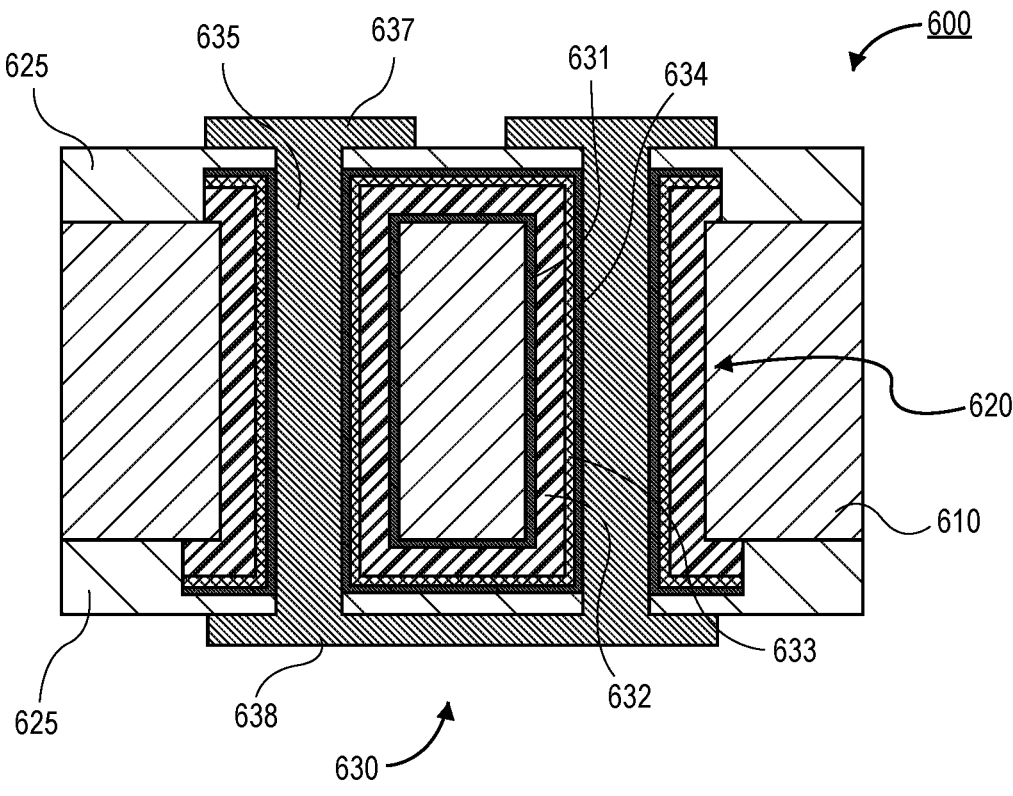
FIG. 6C is a cross-sectional illustration of an inductor loop with inductors that are coupled to pads through a buildup layer, in accordance with an embodiment.

Referring now to FIGS. 6A-6C, a series of cross-sectional illustrations depicting additional electronic package 600 architectures is shown, in accordance with additional embodiments.

Referring now to FIG. 6A, a cross-sectional illustration of an electronic package 600 is shown, in accordance with an embodiment. The electronic package 600 may comprise a core 610, such as a glass core. In an embodiment, a pair of vertically oriented inductors 620 pass through the core 610 and are coupled together by a trace 638 to form an inductor loop 630. Each of the inductors 620 may comprise a first seed layer 631, a magnetic layer 632, an insulator layer 633, a second seed layer 634, and a via 635. The layers 631-635 may be substantially similar to similarly named features described in greater detail above. However, instead of fully polishing the top and bottom surfaces to remove layers 631-635 from over the top and bottom surfaces of the core 610, portions of the layers 631-635 remain on the top surface and bottom surface of the core 610. In an embodiment, the layers may be patterned in order to isolate them from each other. For example, pads 637 for each inductor 620 are electrically isolated from each other. In an embodiment, insulators 641 may be provided along patterned edges of the layers 631-634.

Referring now to FIG. 6B, a cross-sectional illustration of an electronic package 600 is shown, in accordance with an additional embodiment. In an embodiment, the electronic package 600 in FIG. 6B may be substantially similar to the electronic package 600 in FIG. 6A with exception of the layers 631-634. Instead of being patterned so the layers 631-634 in each inductor 620 are isolated from each other, the layers 631-633 may wrap around the top and bottom surfaces of the core 610. In such an embodiment, portions of the layers 631-633 may form a continuous ring that wraps through the inductor 620 on the left and the inductor 620 on the right. In an embodiment, a gap may be provided in the second seed layer 634 in order to prevent shorting the top pads 637 of the inductors 620.

Referring now to FIG. 6C, a cross-sectional illustration of an electronic package 600 is shown, in accordance with an additional embodiment. In an embodiment, the electronic package 600 in FIG. 6C may be substantially similar to the electronic package 600 in FIG. 6B, with the addition of buildup layers 625 over the top and bottom surfaces of the core 610. As such, the pads 637 and the trace 638 are provided over the buildup layers 625 instead of being formed directly over the top and bottom surfaces of the inductors 620.

Figure 7:
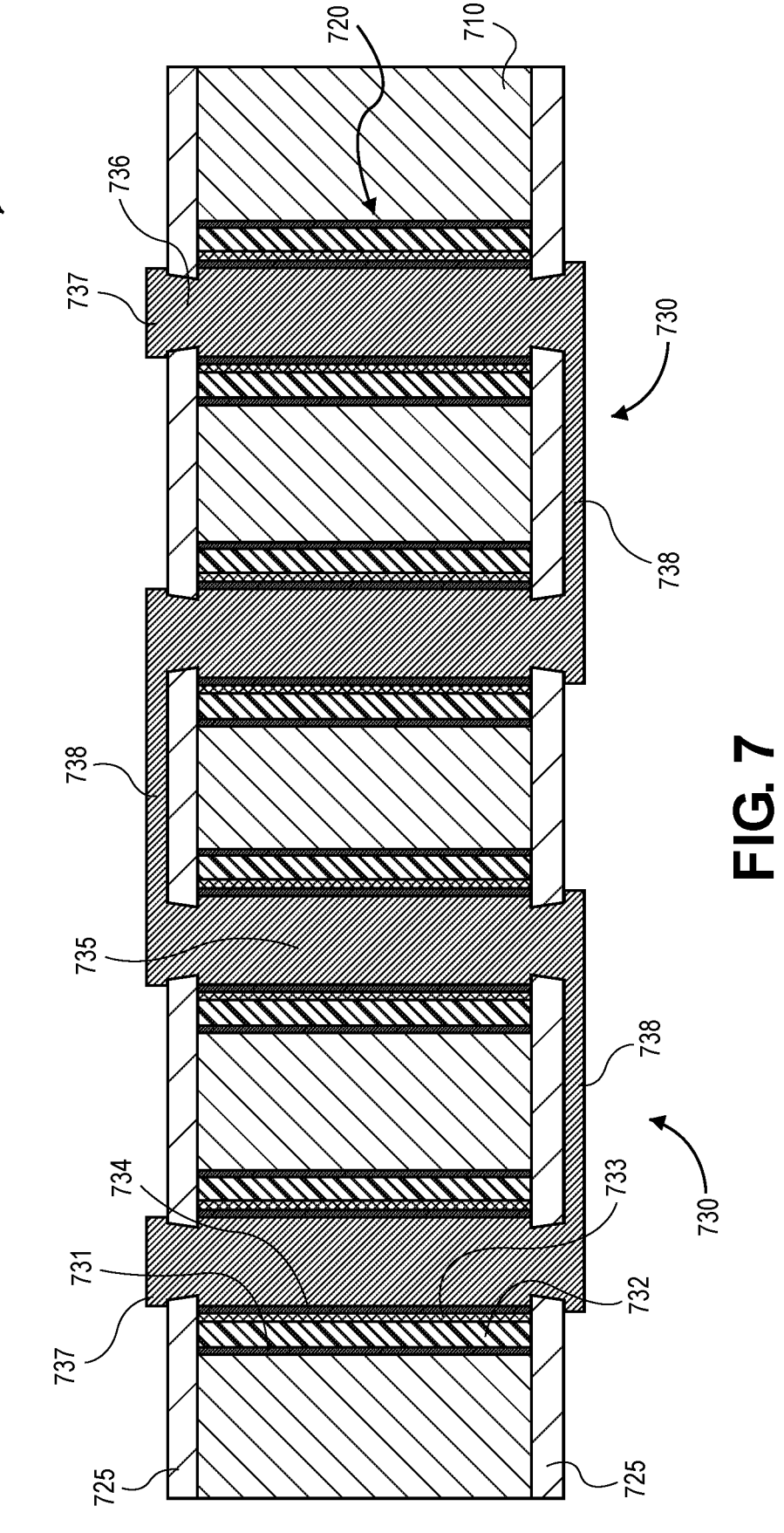
FIG. 7 is a cross-sectional illustration of an electronic package with a pair of inductor loops that are coupled together in series, in accordance with an embodiment.

Referring now to FIG. 7, a cross-sectional illustration of an electronic package 700 is shown, in accordance with an embodiment. In an embodiment, the electronic package 700 comprises a core 710, such as a glass core 710. In an embodiment, buildup layers 725 may be provided above and below the core 710. The electronic package may further comprise a plurality of inductor loops 730. In an embodiment, the plurality of inductor loops 730 are electrically connected to each other in series by a trace 738. Each inductor loop 730 may comprise a pair of inductors 720 that are coupled together in series by traces 738. The individual inductors 720 may be substantially similar to any of the inductors described in greater detail above. For example, the inductors 720 may comprise a first seed layer 731, a magnetic layer 732, an insulator layer 733, a second seed layer 734, and a via 735. Ends of the multi-turn inductor may include pads 737 that are coupled to the vias 735 by vias 736 through the buildup layers 725.

Figure 8:
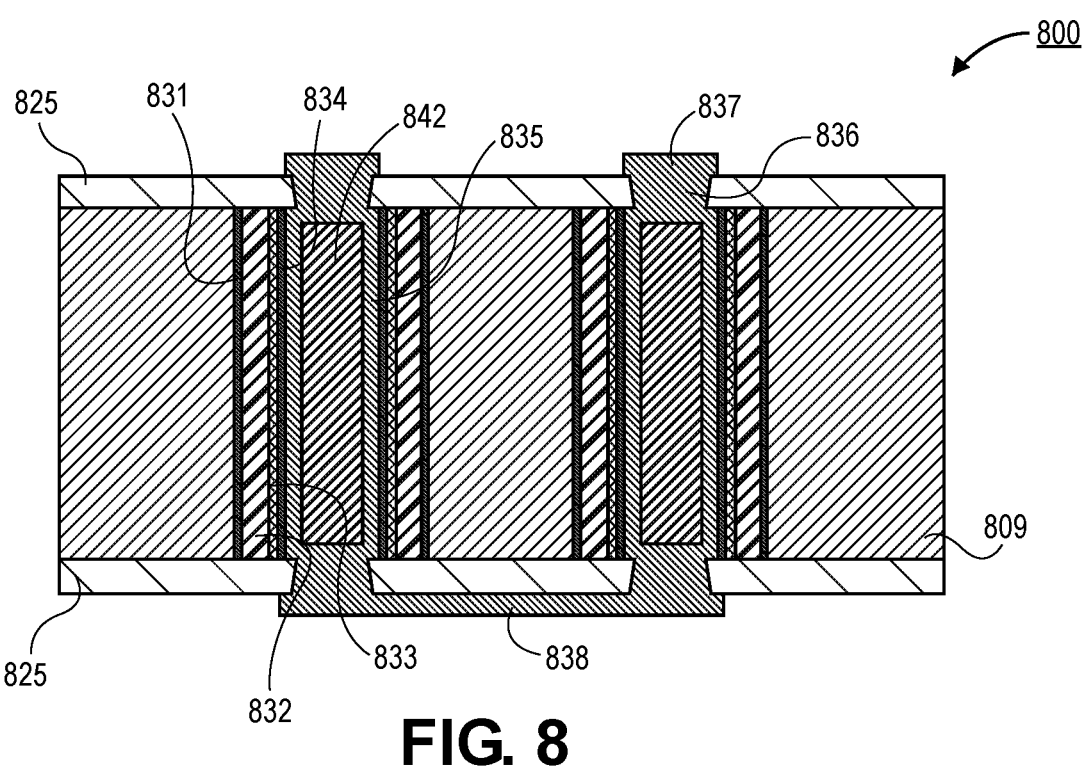
FIG. 8 is a cross-sectional illustration of an inductor loop disposed in an organic glass fiber woven core, in accordance with an embodiment.

Referring now to FIG. 8, a cross-sectional illustration of an electronic package 800 is shown, in accordance with an additional embodiment. The embodiment shown in FIG. 8 may differ from the embodiments described in greater detail above in that the core 809 is not a glass core. Instead, the core 809 may be an organic glass fiber woven core 809. However, a similar inductor loop structure may be provided. In such an embodiment, the vertically oriented inductors may be formed through holes in the core 809 formed by drilling processes. In an embodiment, the inductors include a first seed layer 831, a magnetic layer 832, an insulator layer 833, a second seed layer 834, and a plated through hole (PTH) via 835. The PTH via 835 may be plugged with an organic plugging material 842. Pads 837 may be coupled to the PTH via 835 by vias 836 through the buildup layer 825. Similar vias 836 can couple the inductors to a trace 838 that couples together the inductors.

In an embodiment, the inductors described herein can be used in several ways within a platform that features voltage regulators (e.g., a fully integrated voltage regulator (FIVR)). Such examples are shown in FIGS. 9A-9C.

Figure 9A:
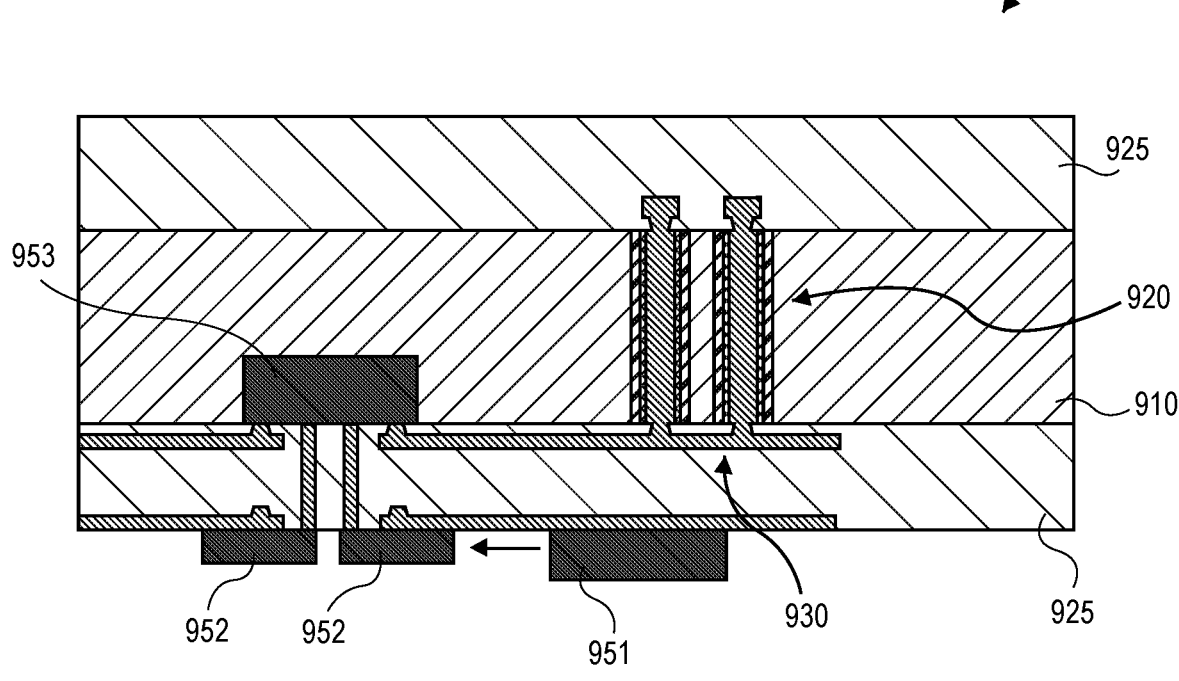
FIG. 9A is a cross-sectional illustration of an electronic package that includes an inductor loop, in accordance with an embodiment.

Referring now to FIG. 9A, an electronic package 900 is shown, in accordance with an embodiment. In an embodiment, the electronic package 900 comprises a core 910, such as a glass core 910. Buildup layers 925 may be provided above and below the core 910. In an embodiment, the electronic package 900 comprises a controller that is electrically coupled to one or more drivers 952. The drivers 952 may be coupled to a power bridge 953 that is embedded in the core 910. The power bridge 953 is electrically coupled to an inductor loop 930 that comprises a pair of inductors 920. The top side of the inductors 920 may in turn be coupled to a die (not shown).

Figure 9B:
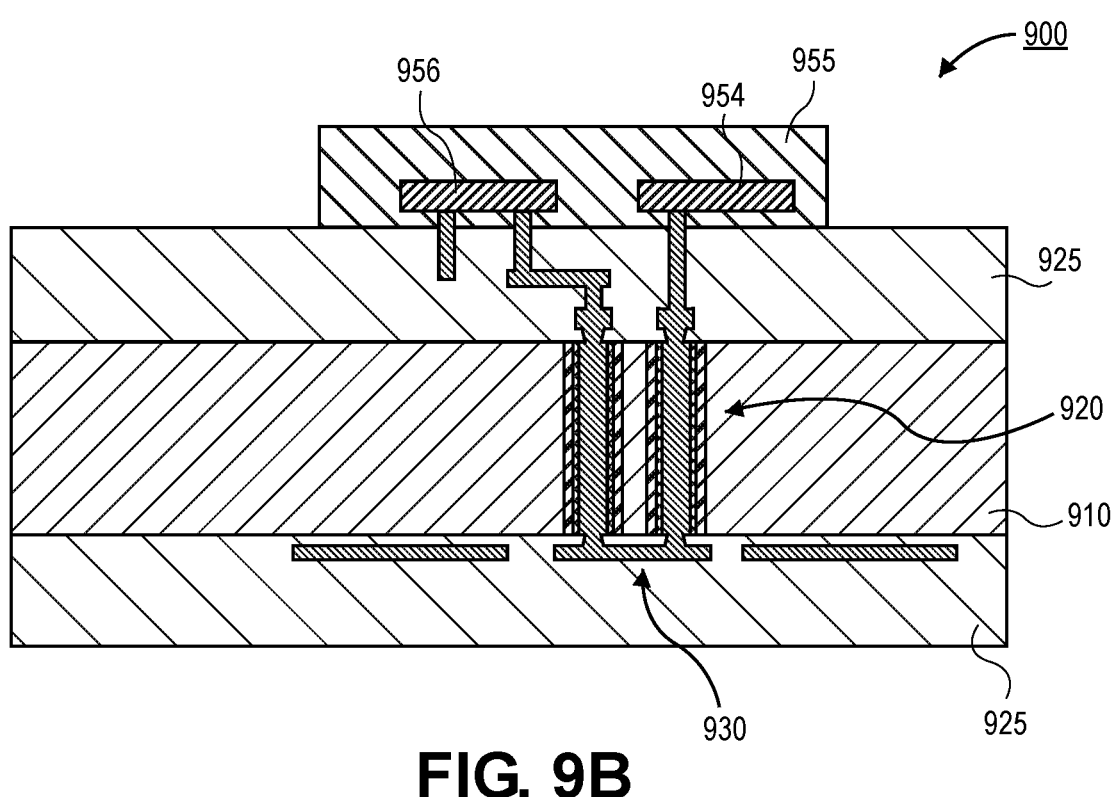
FIG. 9B is a cross-sectional illustration of an electronic package with an inductor loop that is coupled to a die, in accordance with an embodiment.

Referring now to FIG. 9B, an electronic package 900 is shown, in accordance with an additional embodiment. In an embodiment, the electronic package 900 comprises a core 910, such as a glass core 910. Dielectric buildup layers 925 may be provided above and below the core 910. In an embodiment, a die 955 is coupled to the top buildup layers 925. While shown as being directly on the buildup layer 925, it is to be appreciated that there may be an interconnect (e.g., solder, copper bumps, etc.) between the buildup layer 925 and the die 955. In an embodiment, the die 955 comprise a voltage regulator (VR) module 956 and a core 954. The VR module 956 may be electrically coupled to the core 954 through an inductor loop 930 that includes a pair of inductors 920.

Figure 9C:
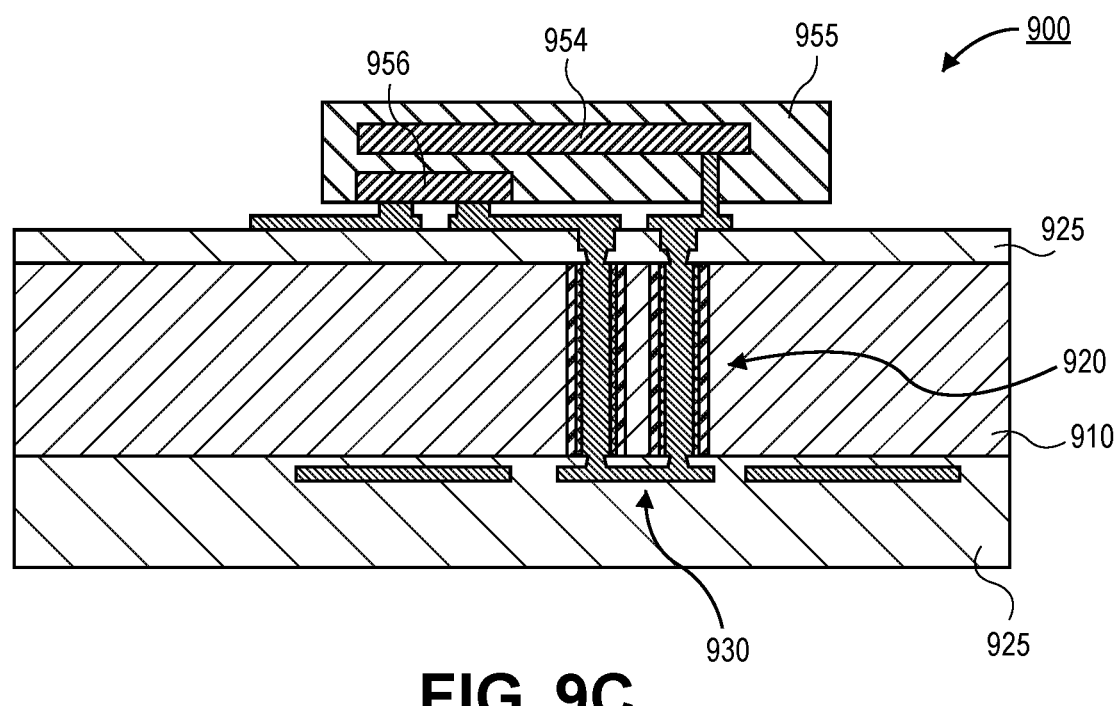
FIG. 9C is a cross-sectional illustration of an electronic package with an inductor loop that is coupled to a die, in accordance with an additional embodiment.

Referring now to FIG. 9C, an electronic package 900 is shown, in accordance with an additional embodiment. In an embodiment, the electronic package 900 in FIG. 9C may be similar to the electronic package 900 in FIG. 9B, with the exception of the orientation of the VR module 956 and the core 954. As shown, the core 954 is provided over the VR module 956. Additionally, the number of buildup layers 925 over the core 910 is reduced. For example, a single buildup layer 925 may be provided over the core 910. However, similar to FIG. 9B, an inductor loop 930 with a pair of inductors 920 electrically couples the VR module 956 to the core 954.

Figure 10A:
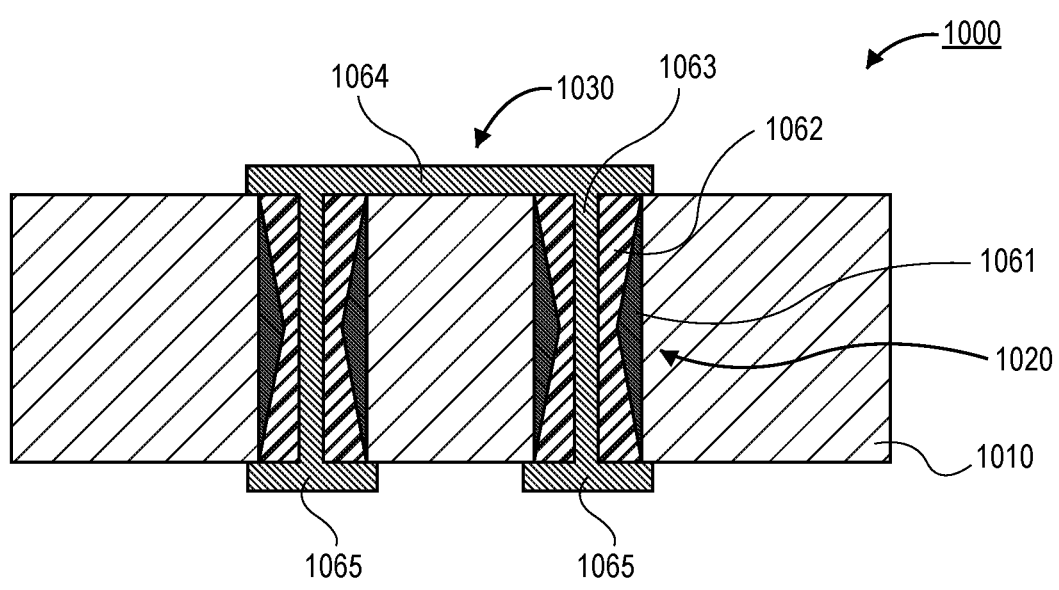
FIG. 10A is a cross-sectional illustration of an inductor loop with magnetic material that has an hourglass shaped profile and a via with vertical sidewalls, in accordance with an embodiment.
Figure 10B:
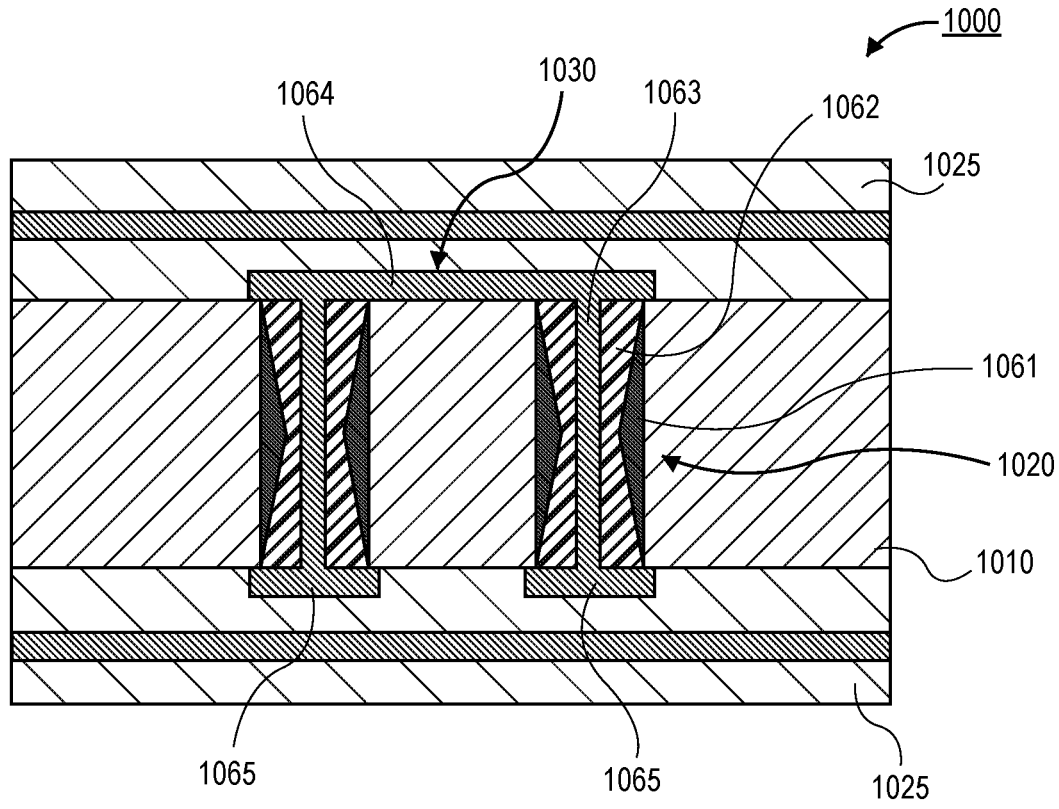
FIG. 10B is a cross-sectional illustration of an electronic package with an inductor loop in a core with buildup layers over the core, in accordance with an embodiment.
Figure 10C:
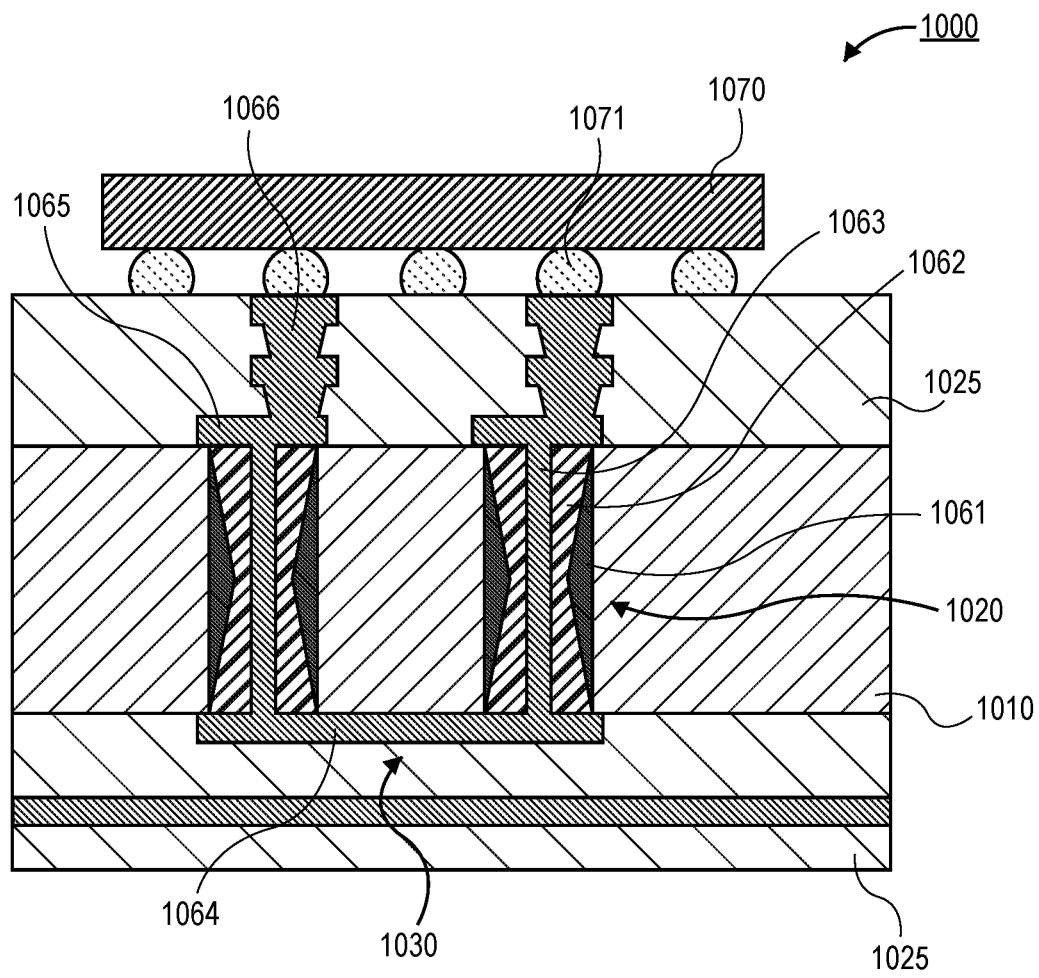
FIG. 10C is a cross-sectional illustration of an electronic package with an inductor loop in a core that is coupled to a die, in accordance with an embodiment.

Referring now to FIGS. 10A-10C, a series of cross-sectional illustrations depicting electronic packages 1000 is shown, in accordance with an additional embodiment. In the embodiments disclosed in FIGS. 10A-10C, the inductors 1020 are fabricated with a template structure, as will be described in greater detail below. The use of a template structure results in the formation of an inductor 1020 that has a magnetic layer with an hourglass shaped cross-section and a via with vertical sidewalls.

Referring now to FIG. 10A, a cross-sectional illustration of an electronic package 1000 is shown, in accordance with an embodiment. In an embodiment, the electronic package 1000 includes a core 1010, such as a glass core 1010. In an embodiment, a plurality of inductors 1020 are provided through a thickness of the glass core 1010. For example, a pair of inductors 1020 are coupled together by a trace 1064 in order to form an inductor loop 1030.

In an embodiment, the inductors 1020 comprise a magnetic layer 1062. In an embodiment, the magnetic layer 1062 may have outer sidewalls that are tapered. For example, the outer sidewalls may form an hourglass shaped profile. The magnetic layer 1062 may be a magnetic paste material. For example, the magnetic layer 1062 may comprise an organic matrix that is filled with magnetic particles. In an embodiment, a region 1061 of the core 1010 adjacent to the magnetic layer 1062 may have a different microstructure than the remainder of the core 1010. For example, the region 1061 may have a crystalline microstructure, and the remainder of the core 1010 may have an amorphous microstructure.

In an embodiment, a via 1063 may pass through the core 1010. The via 1063 may be positioned within the magnetic layer 1062. That is, the magnetic layer 1062 may surround the via 1063. In an embodiment, the via 1063 may have sidewalls that have a different profile than the sidewalls of the magnetic layer 1062. In the particular embodiment shown in FIG. 10A, the sidewalls of the via 1063 are substantially vertical. Pads 1065 may be provided over first ends of the via 1063 and the trace 1064 may be provided over a second end of the via 1063 in order to form the inductor loop 1030.

Referring now to FIG. 10B, a cross-sectional illustration of an electronic package 1000 is shown, in accordance with an additional embodiment. The electronic package 1000 in FIG. 10B may be substantially similar to the electronic package 1000 in FIG. 10A, with the exception of there being buildup layers 1025 over the core 1010. The buildup layers 1025 may provide routing from the inductor loop 1030 to a die or other component (not shown) over the buildup layers 1025. While not shown as being connected to routing in the buildup layers 1025, it is to be appreciated that the inductor loop 1030 will be coupled to conductive routing in the buildup layers 1025.

Referring now to FIG. 10C, a cross-sectional illustration of an electronic package 1000 is shown, in accordance with an additional embodiment. The electronic package 1000 in FIG. 10C may be substantially similar to the electronic package 1000 in FIG. 10B, with the addition of routing and a die 1070. In an embodiment, the pads 1065 of the inductors 1020 may be coupled to interconnects 1071 by vias 1066 through the buildup layers 1025. In an embodiment, the die 1070 may be any type of die, such as a processor, a graphics processor, a memory, an SoC, or the like.

Referring now to FIGS. 11A-11G, a series of cross-sectional illustrations depicting a process for forming inductor loops in a core is shown, in accordance with an embodiment. Particularly, the inductor loops include inductors that may be similar to the inductors described above with respect to FIGS. 10A-10C.

Figure 11A:
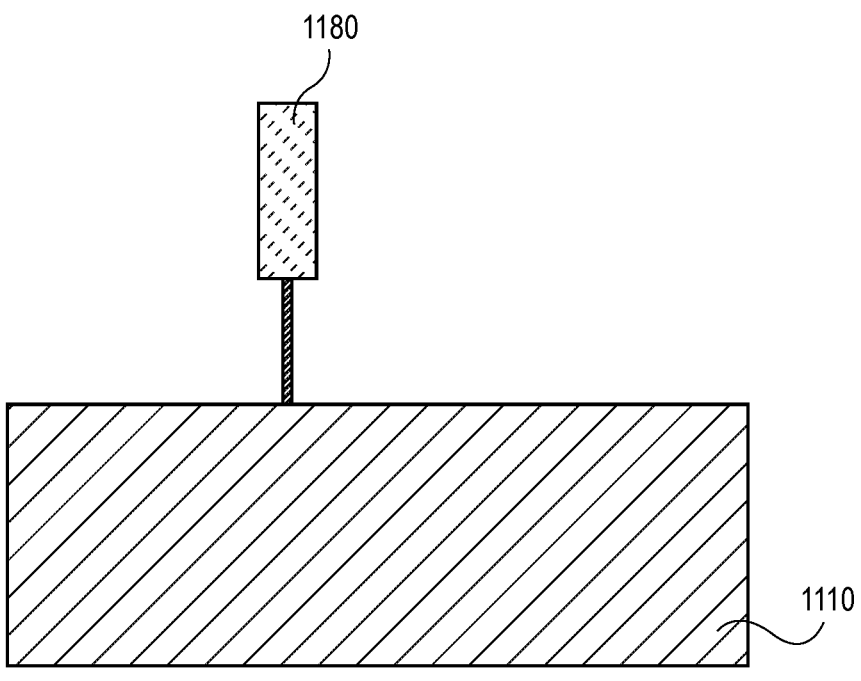
FIGS. 11A-11G are cross-sectional illustrations depicting a process for forming an inductor loop with a template structure, in accordance with an embodiment.

Referring now to FIG. 11A, a cross-sectional illustration of a core 1110 is shown, in accordance with an embodiment. In an embodiment, the core 1110 may comprise a glass core 1110. In an embodiment, the core 1110 may be exposed by a laser 1180 in order to implement a laser assisted etching process.

Figure 11B:
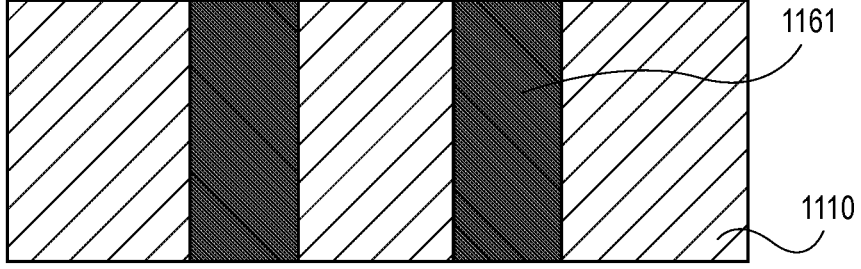

Referring now to FIG. 11B, a cross-sectional illustration of the core 1110 after the exposed regions 1161 are formed is shown, in accordance with an embodiment. In an embodiment, the exposed regions 1161 may extend through a thickness of the core 1110. In an embodiment, the exposed regions 1161 may have a microstructure that is different than the remaining portions of the core 1110. For example, the exposed regions 1161 may have a crystalline microstructure, and the remainder of the core 1110 may have an amorphous microstructure.

Figure 11C:
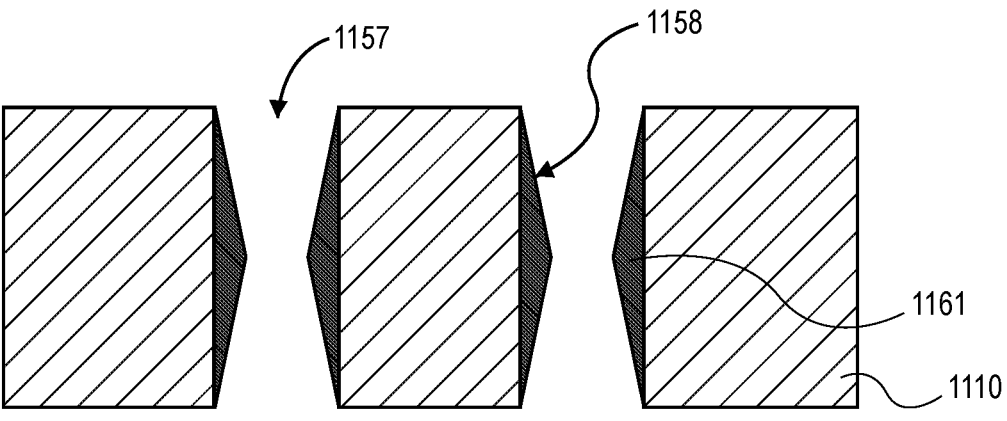

Referring now to FIG. 11C, a cross-sectional illustration of the core 1110 after an etching process is used to remove exposed portions 1161 of the core 1110 is shown, in accordance with an embodiment. In an embodiment, the etching process may be a wet etching process. In an embodiment, the etching process may result in sidewalls 1158 that are tapered. For example, the openings 1157 may have an hourglass shaped profile. In an embodiment, the openings 1157 may have a diameter of approximately 1,000 μm or smaller. Portions of the exposed region 1161 may persist in the structure of the core 1110.

Figure 11D:
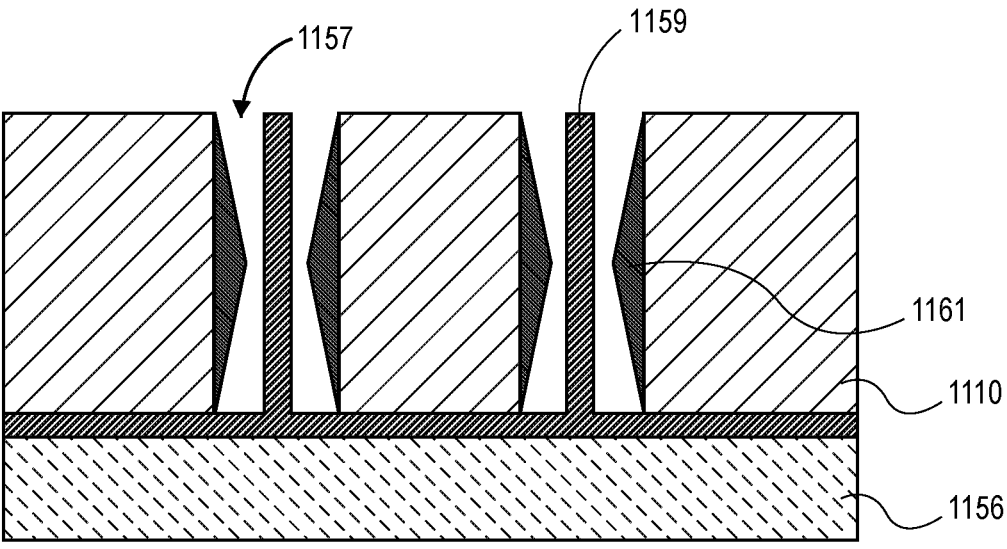

Referring now to FIG. 11D, a cross-sectional illustration of the core 1110 after a template structure 1159 is inserted into the openings 1157 is shown, in accordance with an embodiment. In an embodiment, the template structure 1159 may be coupled to a carrier 1156. In an embodiment, the template structure 1159 includes substantially vertical sidewalls. The template structures 1159 may have a diameter of approximately 100 μm or smaller, or approximately 10 μm or smaller. The template structure 1159 may be a material that can be removed after the formation of the magnetic layer in a subsequent processing operation. For example, the template structure 1159 may be a polymer that can be melted in order to be removed from the core 1110. In other embodiments, the template structure 1159 is a material that is structurally sound enough to be mechanically pulled out from the magnetic layer.

Figure 11E:
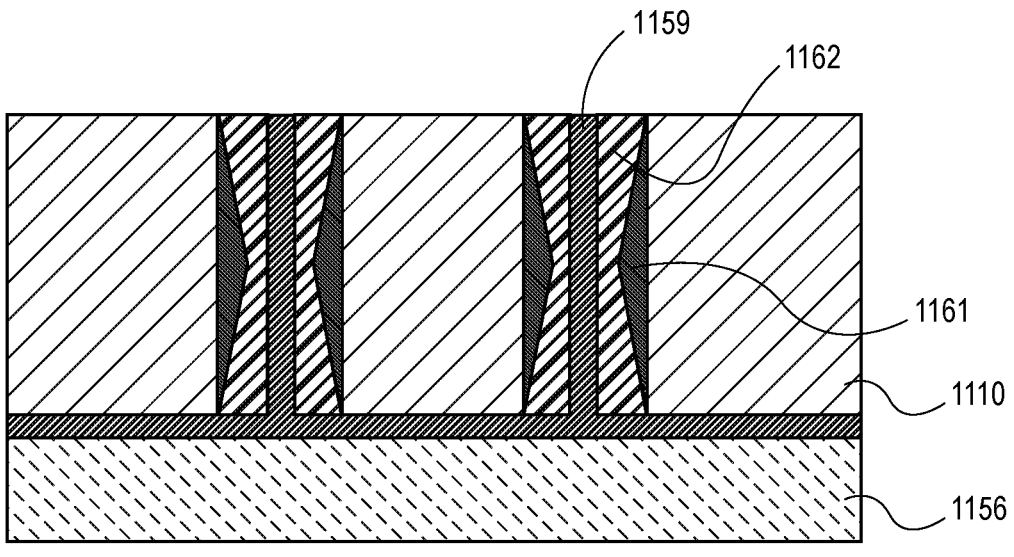

Referring now to FIG. 11E, a cross-sectional illustration of the core 1110 after the magnetic layer 1162 is deposited is shown, in accordance with an embodiment. In an embodiment, the magnetic layer 1162 may be a magnetic paste material. The magnetic layer 1162 may be disposed around the template structure 1159 structure with a plugging process or the like.

Figure 11F:
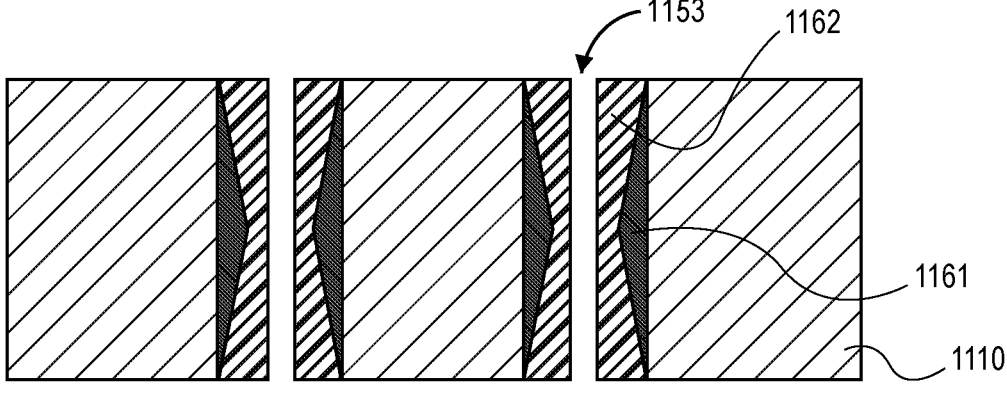

Referring now to FIG. 11F, a cross-sectional illustration of the core 1110 after the template structure 1159 is removed is shown, in accordance with an embodiment. In an embodiment, the template structure 1159 may be removed with a melting process. In an alternative embodiment, the template structure 1159 may be mechanically pulled out of the magnetic layer 1162. In such an embodiment, the template structures 1159 may be reused in subsequent processing operations. While two examples of template structures 1159 are provided in FIGS. 11A-11F, it is to be appreciated that other material regimes and material removal processes may be used for the template structure 1159, as will be described below in greater detail. Removal of template structure 1159 results in the formation of openings 1153 through the magnetic layer 1162.

Figure 11G:
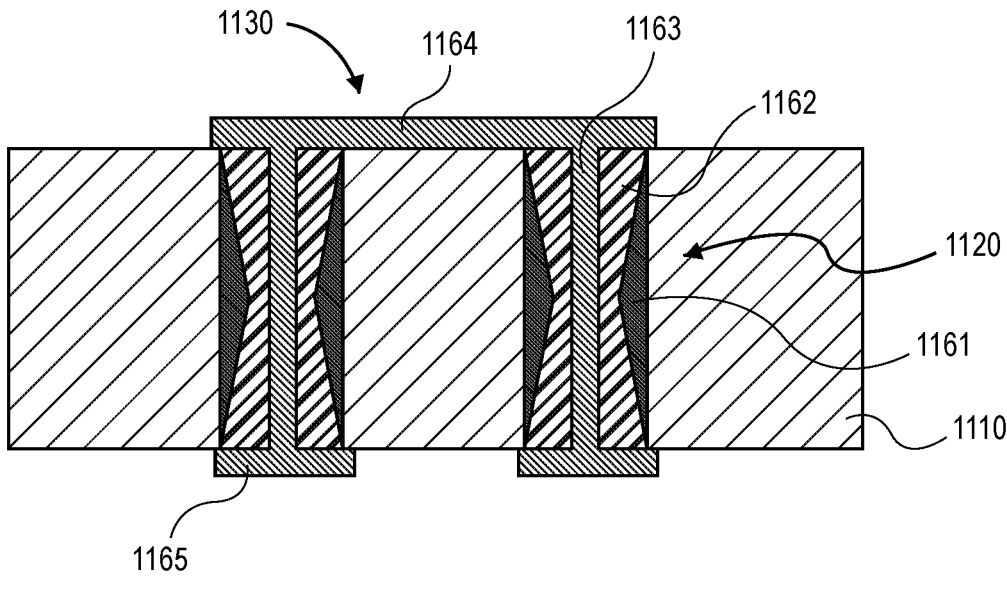

Referring now to FIG. 11G, a cross-sectional illustration of the core 1110 after the vias 1163, pads 1165, and trace 1164 are formed is shown, in accordance with an embodiment. In an embodiment, the vias 1163, the pads 1165, and trace 1164 may be formed with any suitable plating or deposition process. Trace 1164 may couple a first inductor 1120 to a second inductor 1120.

Referring now to FIGS. 12A-12D, a series of cross-sectional illustrations depicting additional processes to form inductor loops 1230 in a core 1210 is shown, in accordance with an additional embodiment.

Figure 12A:
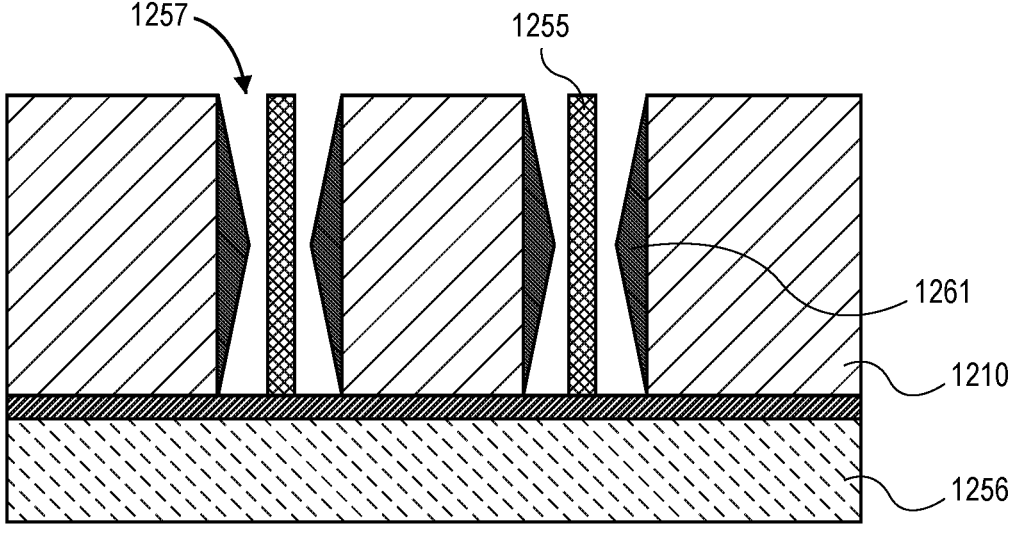
FIGS. 12A-12D are cross-sectional illustration depicting a process for forming an inductor loop with a template structure that is etched away, in accordance with an embodiment.

Referring now to FIG. 12A, a cross-sectional illustration of a core 1210 that has been patterned to form openings 1257 is shown, in accordance with an embodiment. In an embodiment, the openings 1257 may be formed with processes substantially similar to those described above with respect to FIGS. 11A-11C, which will not be repeated here. For example, openings 1257 may pass through exposed regions 1261 of the core 1210. In an embodiment, template structures 1255 connected to a carrier 1256 are inserted into the openings 1257. In an embodiment, the template structures 1255 may be a material that can be selectively etched with respect to the magnetic material disposed in a subsequent processing operation.

Figure 12B:
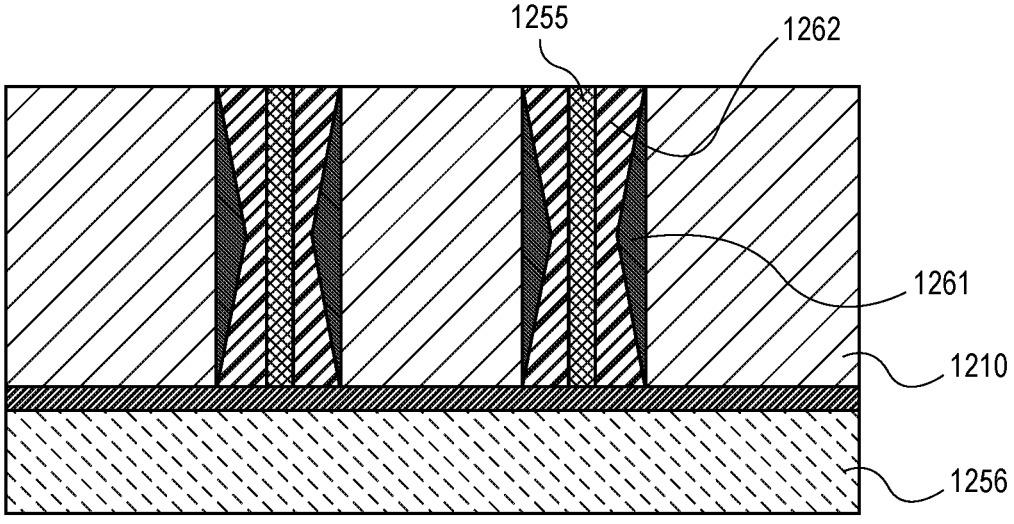

Referring now to FIG. 12B, a cross-sectional illustration of the core 1210 after the magnetic layer 1262 is disposed around the template structures 1255 is shown, in accordance with an embodiment. In an embodiment, the magnetic layer 1262 may be a magnetic paste material. The magnetic layer 1262 may be disposed around the template structure 1255 with a plugging process or the like.

Figure 12C:
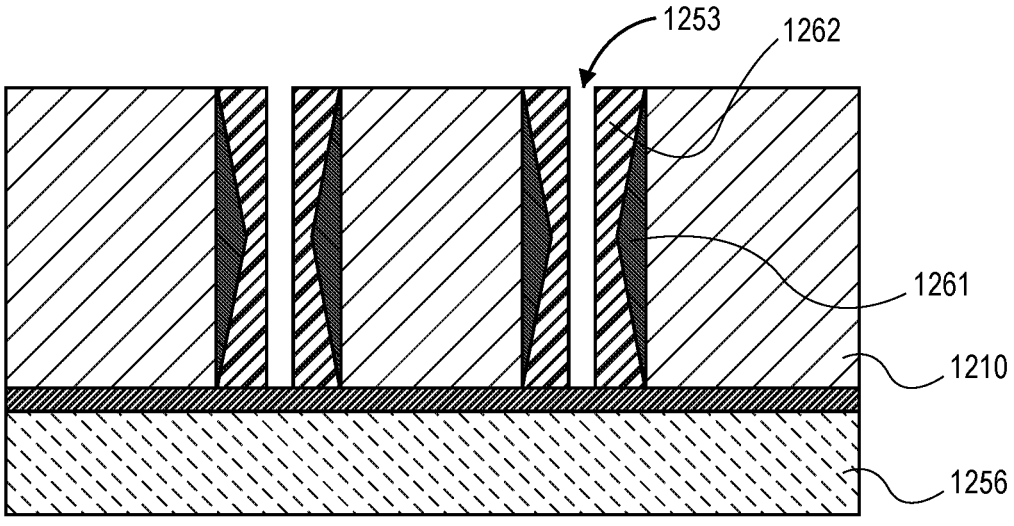

Referring now to FIG. 12C, a cross-sectional illustration of the core 1210 after the template structure 1255 is removed is shown, in accordance with an embodiment. In an embodiment, the template structure 1255 may be removed with an etching process. For example, a wet etching process may be used to remove the template structure 1255 from the magnetic layer 1262. Removal of template structure 1255 results in the formation of openings 1253 through the magnetic layer 1262.

Figure 12D:
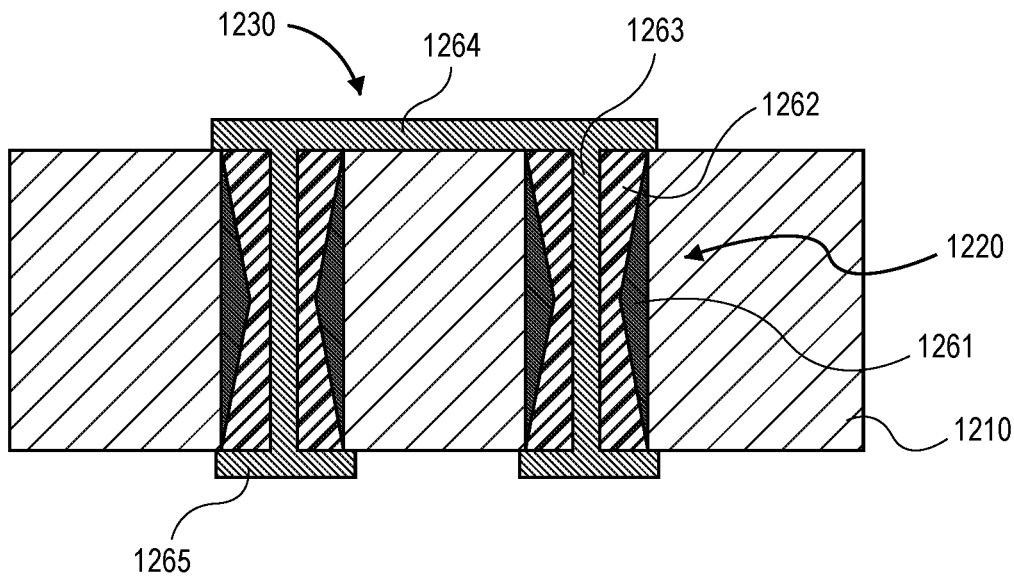

Referring now to FIG. 12D, a cross-sectional illustration of the core 1210 after the vias 1263, pads 1265, and trace 1264 are formed is shown, in accordance with an embodiment. In an embodiment, the vias 1263, the pads 1265, and trace 1264 may be formed with any suitable plating or deposition process. Trace 1264 may couple a first inductor 1220 to a second inductor 1220.

Referring now to FIGS. 13A-13D, a series of cross-sectional illustrations depicting a process for forming an inductor loop 1330 in a core 1310 is shown, in accordance with an embodiment. In an embodiment, the inductor loop 1330 may be formed with a template structure that persists into the final structure as the via of the individual inductors 1320.

Figure 13A:
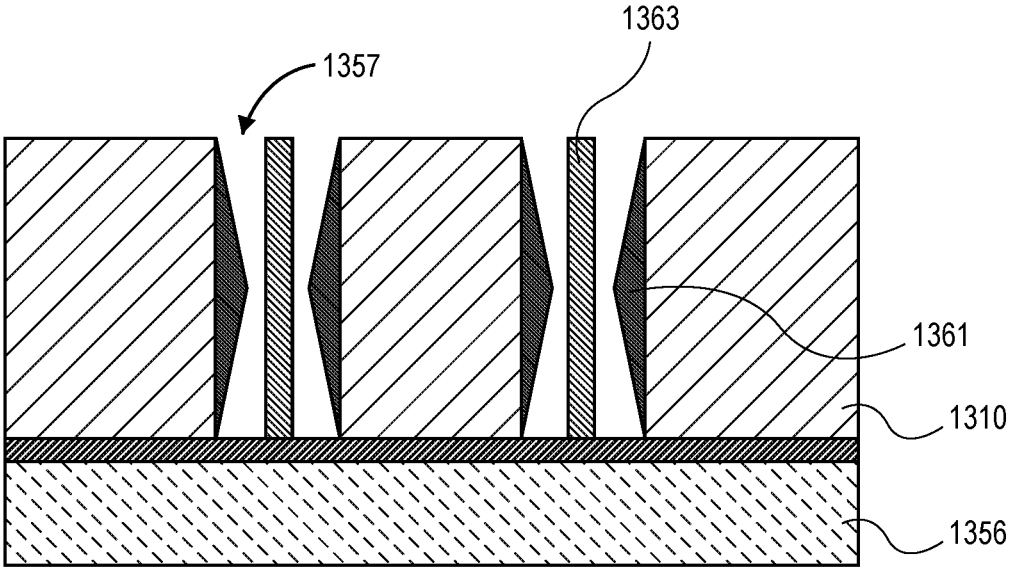
FIGS. 13A-13D are cross-sectional illustrations depicting a process for forming an inductor loop with a template structure that persists in the structure as the conductive vias, in accordance with an embodiment.

Referring now to FIG. 13A, a cross-sectional illustration of a core 1310 that has been patterned to form openings 1357 is shown, in accordance with an embodiment. In an embodiment, the openings 1357 may be formed with processes substantially similar to those described above with respect to FIGS. 11A-11C, which will not be repeated here. For example, openings 1357 may pass through exposed regions 1361 of the core 1310. In an embodiment, template structures 1363 connected to a carrier 1356 are inserted into the openings 1357. In an embodiment, the template structures 1363 may be a conductive material. In a particular embodiment, the template structures 1363 comprise copper.

Figure 13B:
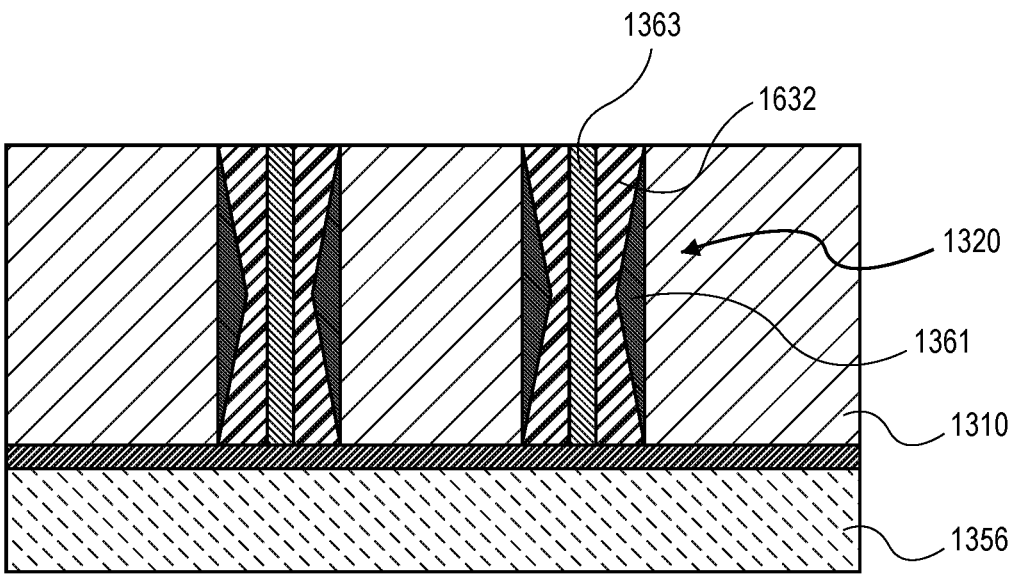

Referring now to FIG. 13B, a cross-sectional illustration of the core 1310 after the magnetic layer 1362 is disposed around the template structures 1363 is shown, in accordance with an embodiment. In an embodiment, the magnetic layer 1362 may be a magnetic paste material. The magnetic layer 1362 may be disposed around the template structure 1363 with a plugging process or the like.

Figure 13C:
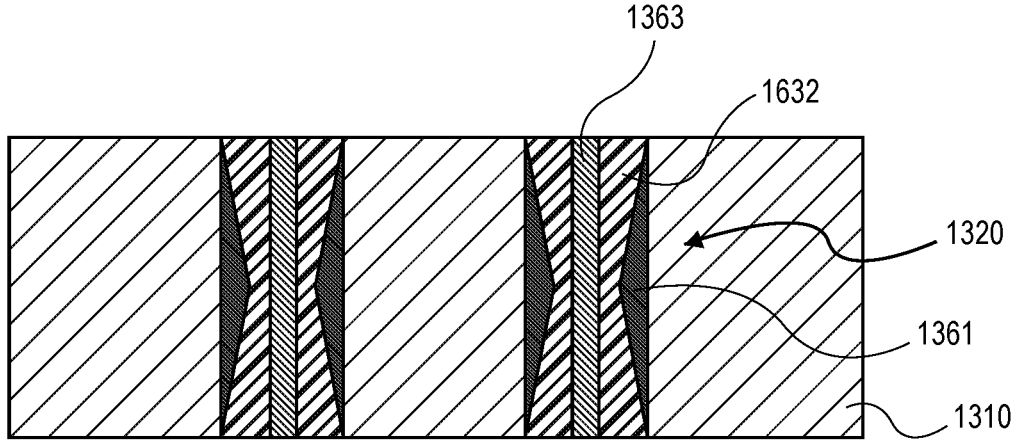

Referring now to FIG. 13C, a cross-sectional illustration of the core 1310 after the carrier 1356 is removed is shown, in accordance with an embodiment. In an embodiment, the carrier 1356 may be removed with a mechanical detachment of the template structures 1363. In other embodiments, the template structures 1363 may be on a release layer that is deactivated in order to release the template structures 1363.

Figure 13D:
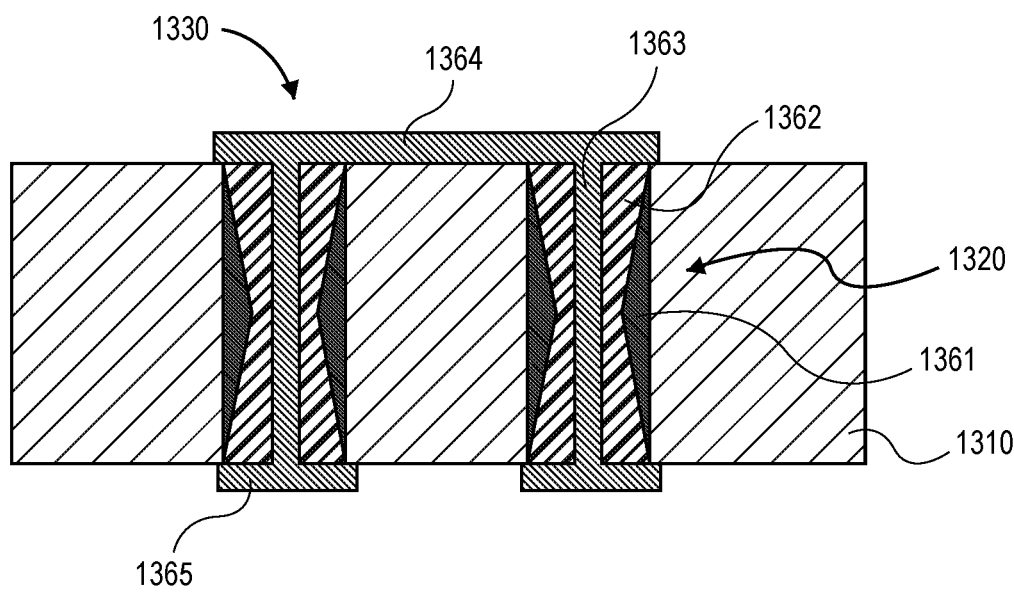

Referring now to FIG. 13D, a cross-sectional illustration of the core 1310 after the pads 1365 and trace 1364 are formed is shown, in accordance with an embodiment. In an embodiment, the pads 1365 and trace 1364 may be formed with any suitable plating or deposition process. Trace 1364 may couple a first inductor 1320 to a second inductor 1320.

Figure 14A:
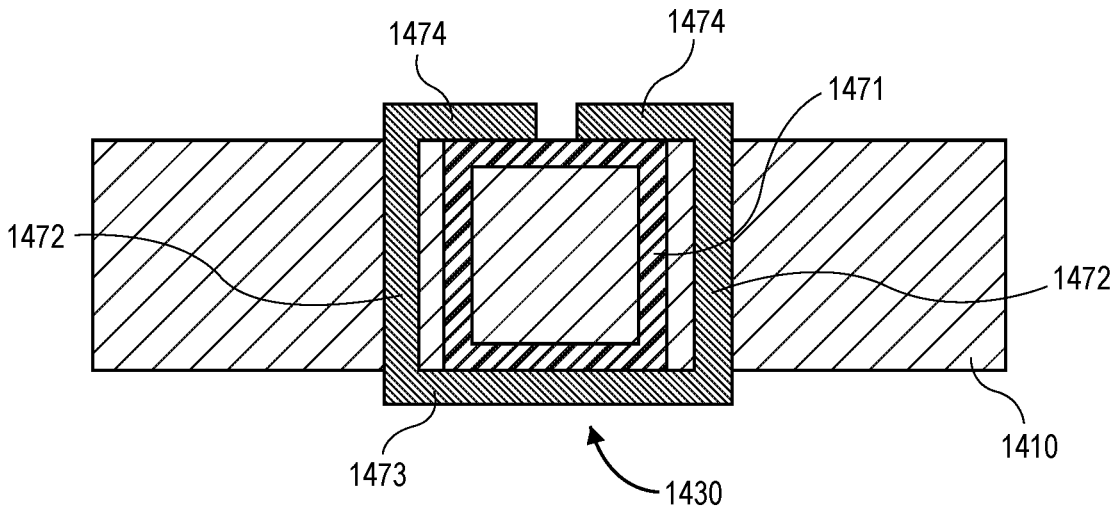
FIG. 14A is a cross-sectional illustration of an inductor loop in a glass core around a magnetic ring, in accordance with an embodiment.
Figure 14B:
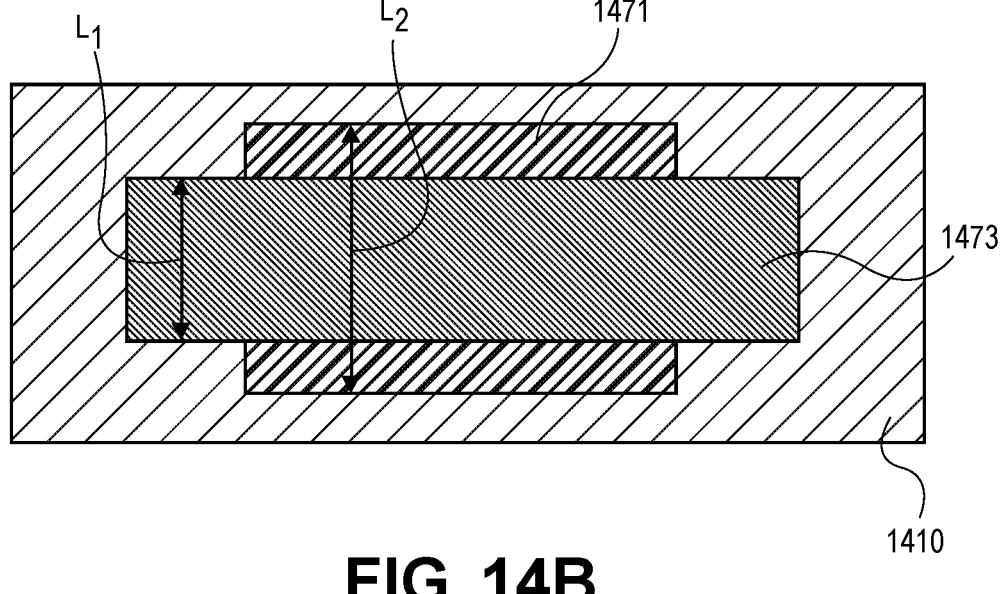
FIG. 14B is a plan view illustration of a bottom surface of the inductor loop in FIG. 14A, in accordance with an embodiment.
Figure 14C:
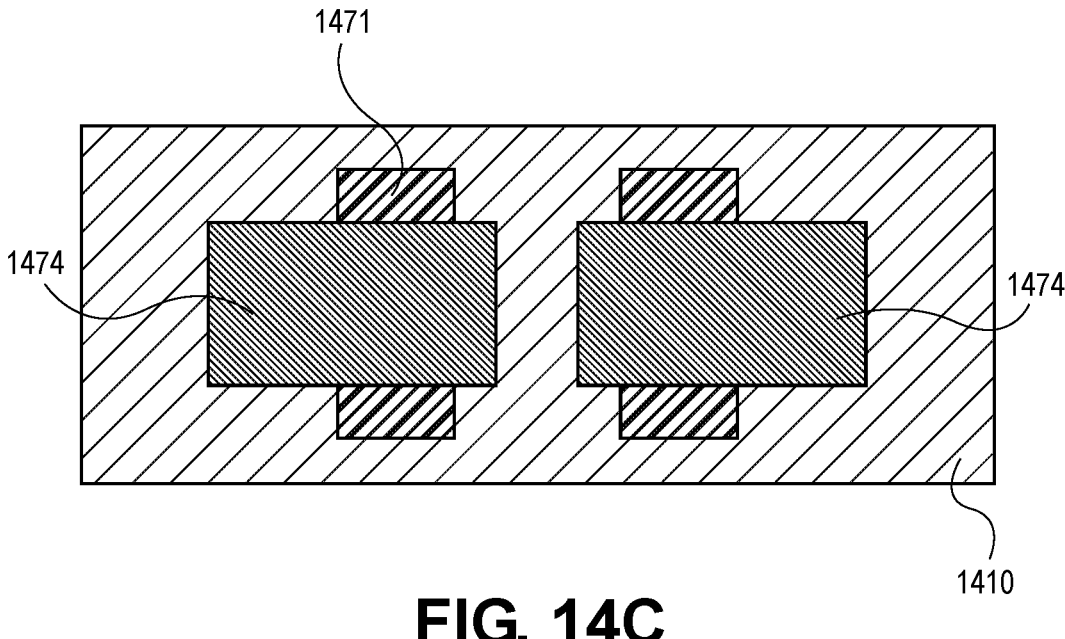
FIG. 14C is a plan view illustration of a top surface of the inductor loop in FIG. 14A, in accordance with an embodiment.

Referring now to FIGS. 14A-14C, illustrations depicting an inductor loop 1430 in a core 1410 are shown, in accordance with an additional embodiment. The inductor loop 1430 is also able to be formed without a mechanical drilling process. As such, the vertical features through the thickness of the core 1410 (e.g., magnetic loops and conductive vias) can be spaced close to each other to improve inductance and reduce the footprint of the structures.

Referring now to FIG. 14A, a cross-sectional illustration of an inductor loop 1430 in a core 1410 is shown, in accordance with an embodiment. In an embodiment, the core 1410 is a glass core 1410. The inductor loop 1430 may comprise conductive vias 1472. The vias 1472 may be connected together by a plane 1473 below the core 1410. Planes 1474 may be provided at the top of the vias 1472. Additionally, the inductor loop 1430 may comprise a magnetic loop 1471 within the conductive features. In an embodiment, the magnetic loop 1471 is embedded within the core 1410. That is, a top surface of the magnetic loop 1471 may be substantially coplanar with a top surface of the core 1410, and a bottom surface of the magnetic loop 1471 may be substantially coplanar with a bottom surface of the core 1410. The top and bottom portions of the magnetic loop 1471 may be in direct contact with the planes 1474 and 1473. In an embodiment, the vertical sidewalls of the magnetic loop 1471 may be spaced away from the conductive vias 1472 by a distance of approximately 10 μm or less, or approximately 5 μm or less.

Referring now to FIG. 14B, a plan view illustration of the bottom surface of the inductor loop 1430 is shown, in accordance with an embodiment. As shown, the bottom plane 1473 can extend laterally a length $L_1$. For example, the length $L_1$ may be greater than a width of a trace formed elsewhere in the device. In an embodiment, the magnetic loop 1471 may also be extended laterally a length $L_2$. The length $L_2$ may be greater than the length $L_1$.

Referring now to FIG. 14C, a plan view illustration of the top surface of the inductor loop 1430 is shown, in accordance with an embodiment. As shown, the planes 1474 extend toward each other with a gap in between. In an embodiment, the top surface of the magnetic loop 1471 may also have a gap.

Referring now to FIGS. 15A-15F, a series of cross-sectional illustrations depicting a process for forming an inductor loop 1530 in a core 1510 is shown, in accordance with an embodiment.

Figure 15A:
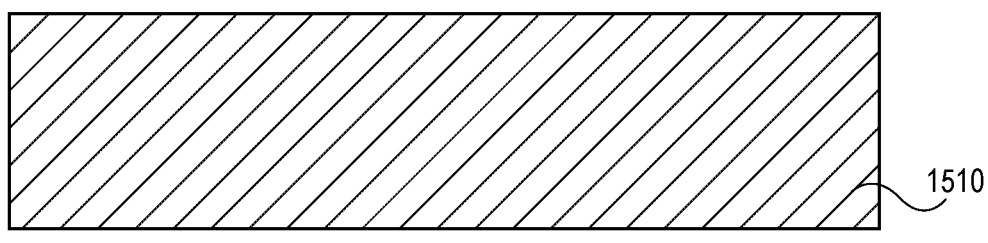
FIGS. 15A-15F are cross-sectional illustrations depicting a process for forming an inductor loop in a glass core, in accordance with an embodiment.

Referring now to FIG. 15A, a cross-sectional illustration of a core 1510 is shown, in accordance with an embodiment. In an embodiment, the core 1510 may be a glass core 1510.

Figure 15B:
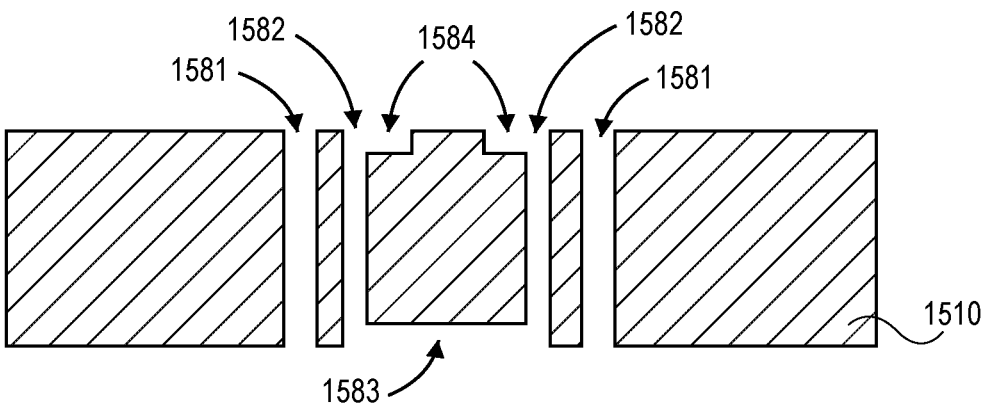

Referring now to FIG. 15B, a cross-sectional illustration of the core 1510 after through holes and blind trenches are formed into the core 1510 is shown, in accordance with an embodiment. In an embodiment, holes 1581, 1582, and blind trenches 1584 and 1583 may be formed with a laser-assisted etching process similar to embodiments described in greater detail above. In an embodiment, holes 1581 are provided for the vias of the conductive loop, and holes 1582 are provided for vertical portions of the magnetic loop. The blind trenches 1584 and 1583 are for the top and bottom portions of the magnetic loop, so they can be fully embedded within the core 1510. In an embodiment, the blind trenches 1584 have a depth of approximately 50 μm or less.

Figure 15C:
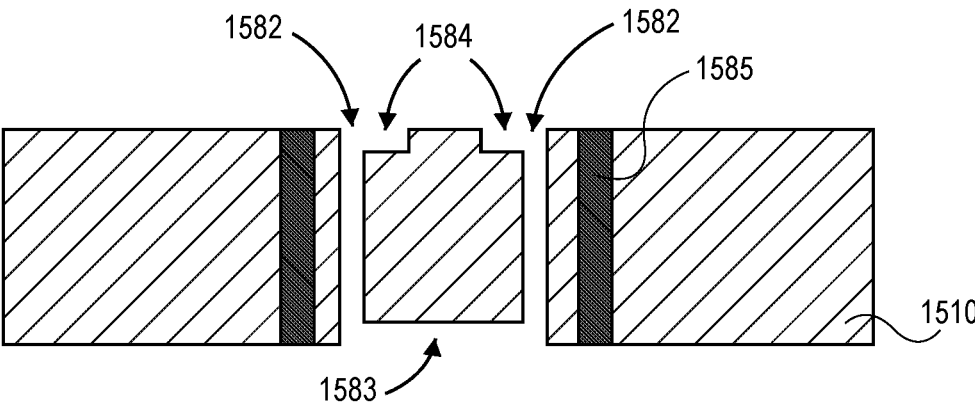

Referring now to FIG. 15C, a cross-sectional illustration of the core 1510 after the holes 1581 are filled with plugs 1585 is shown. In an embodiment, the plugs 1585 cover the holes 1581 so that they are not filled during the deposition of the magnetic material.

Figure 15D:
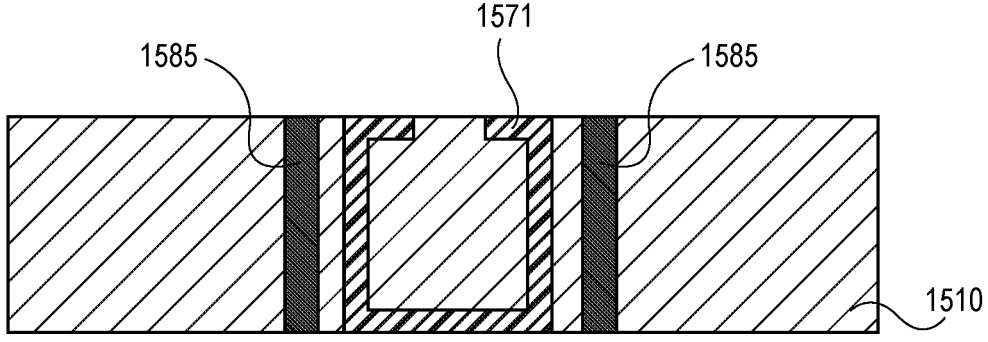

Referring now to FIG. 15D, a cross-sectional illustration of the core 1510 after the magnetic loop 1571 is formed is shown, in accordance with an embodiment. In an embodiment, the magnetic loop 1571 may be a magnetic paste material. In an embodiment, the magnetic paste may be inserted into the holes with a plugging process or the like.

Figure 15E:
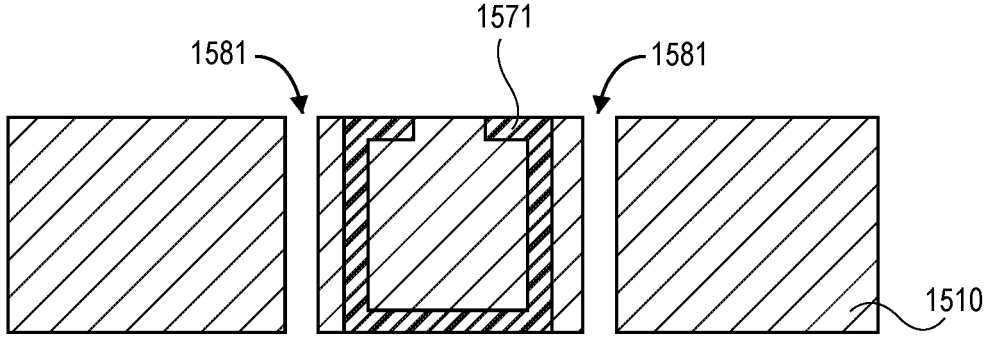

Referring now to FIG. 15E, a cross-sectional illustration of the core 1510 after the plugs 1585 are removed is shown, in accordance with an embodiment. In an embodiment, removal of the plugs 1585 exposes the holes 1581.

Figure 15F:
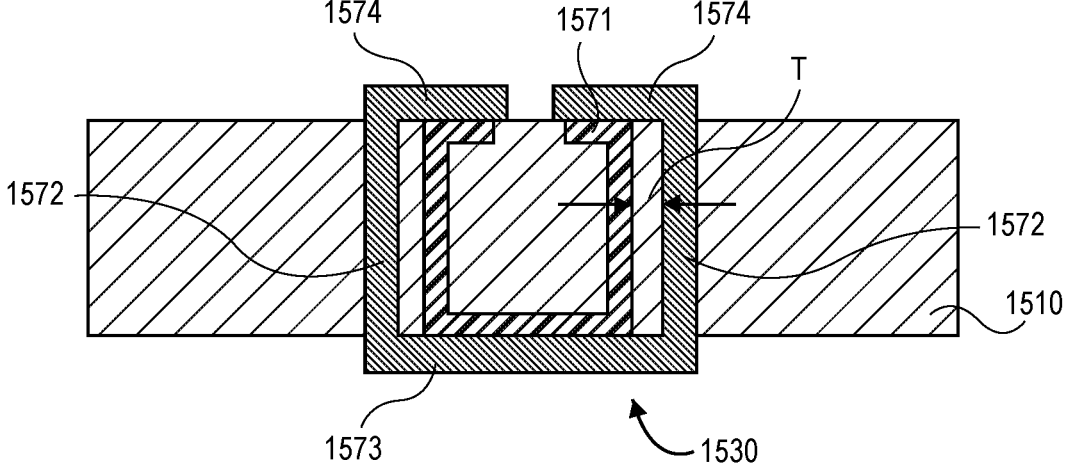

Referring now to FIG. 15F, a cross-sectional illustration of the core 1510 after the conductive loop is formed to complete the inductor loop 1530 is shown, in accordance with an embodiment. In an embodiment, the conductive loop comprises vias 1572, a bottom trace 1573, and top traces 1574. In an embodiment, the inner surface of traces 1572 may be spaced away from the magnetic loop 1571 by a thickness T. For example, the thickness T may be approximately 10 μm or less, or approximately 5 μm or less.

Referring now to FIGS. 16A-16E, a series of cross-sectional illustrations depicting a process for forming an inductor loop 1630 is shown, in accordance with an additional embodiment.

Figure 16A:
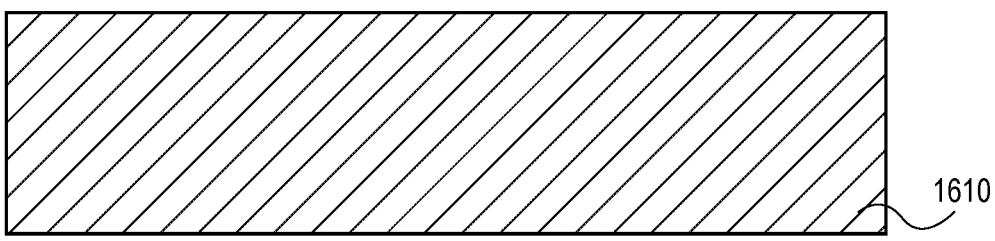
FIGS. 16A-16E are cross-sectional illustrations depicting a process for forming an inductor loop in a glass core, in accordance with an embodiment.

Referring now to FIG. 16A, a cross-sectional illustration of a core 1610 is shown, in accordance with an embodiment. In an embodiment, the core 1610 may be a glass core 1610.

Figure 16B:
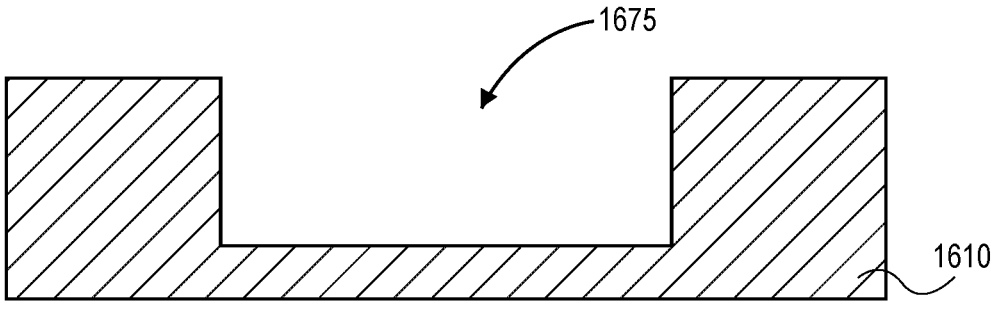

Referring now to FIG. 16B, a cross-sectional illustration of the core 1610 after a blind trench 1675 is formed into the core 1610 is shown, in accordance with an embodiment. In an embodiment, the blind trench 1675 may be formed with a laser-assisted etching process, such as those described in greater detail above. In the illustrated embodiment, the blind trench 1675 has vertical sidewalls. However, it is to be appreciated that the sidewalls may also be tapered in some embodiments.

Figure 16C:
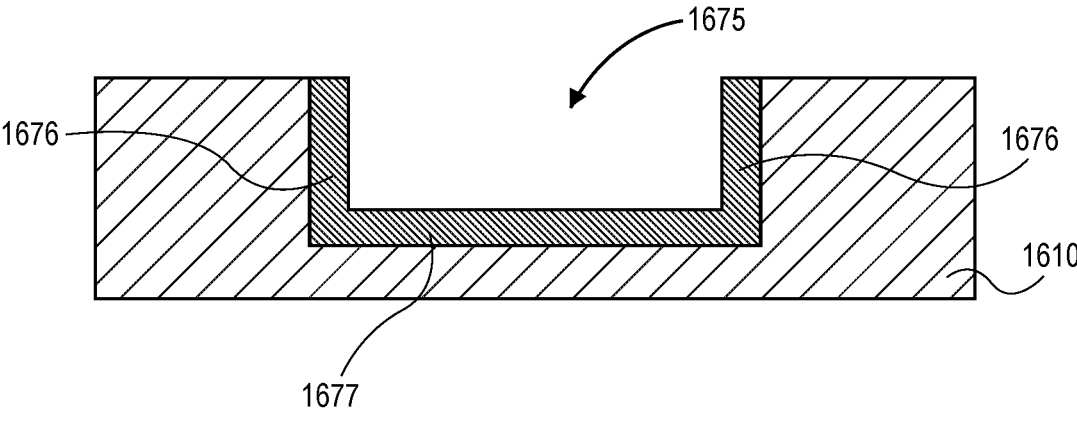

Referring now to FIG. 16C, a cross-sectional illustration of the core 1610 after a conductive liner is disposed in the blind trench 1675 is shown, in accordance with an embodiment. In an embodiment, the conductive liner comprises vertical portions 1676 and a bottom portion 1677. In an embodiment, the conductive liner may be deposited with a conformal deposition process.

Figures 16D, 16E:
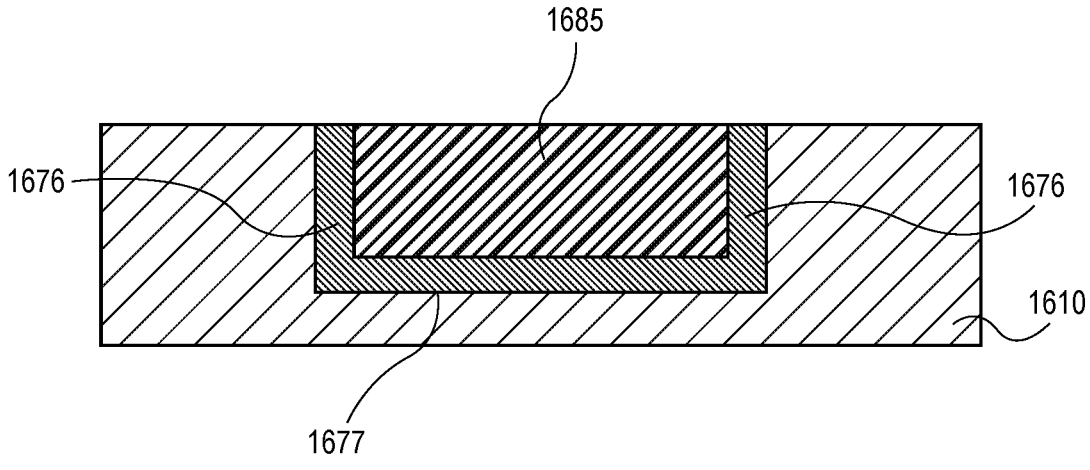

Referring now to FIG. 16D, a cross-sectional illustration of the core 1610 after a magnetic material 1677 is deposited into the blind trench 1675 is shown, in accordance with an embodiment. In an embodiment, the magnetic material 1685 may be a magnetic paste or the like. In an embodiment, the magnetic material 1685 may be deposited with a plugging process or the like.

Referring now to FIG. 16E, a cross-sectional illustration of the core 1610 after top traces 1678 are formed over the magnetic material 1685 is shown, in accordance with an embodiment. In an embodiment, the top traces 1678 may be electrically coupled to the sidewall conductors 1676 in order to form a conductive loop at least partially around the magnetic material 1685.

In the illustrated embodiments above examples of single loop inductors are shown. However, it is to be appreciated that embodiments may include inductors with a plurality of loops. An example of such a structure is shown in FIGS. 17A and 17B.

Figure 17B:
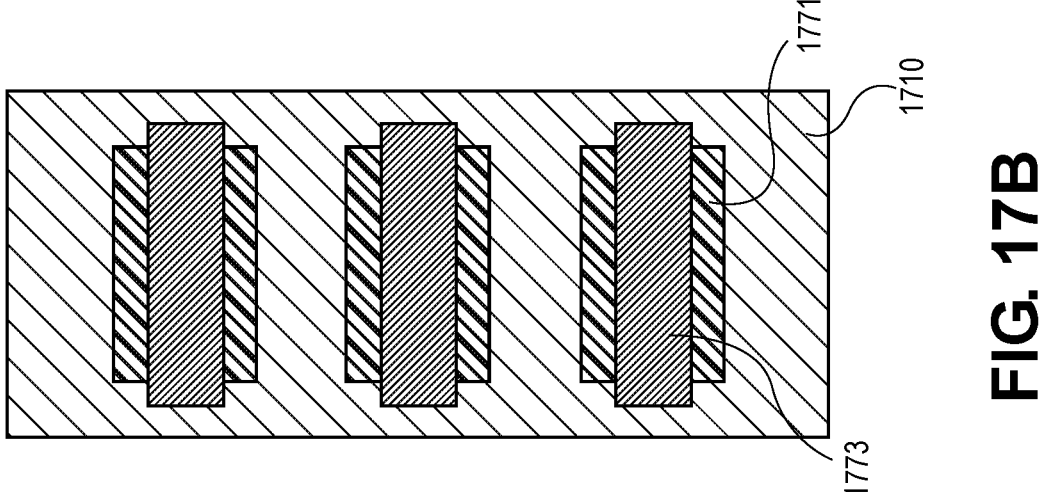
FIG. 17B is a plan view illustration of a bottom surface of the plurality of inductors shown in FIG. 17A, in accordance with an embodiment.
Figure 17A:
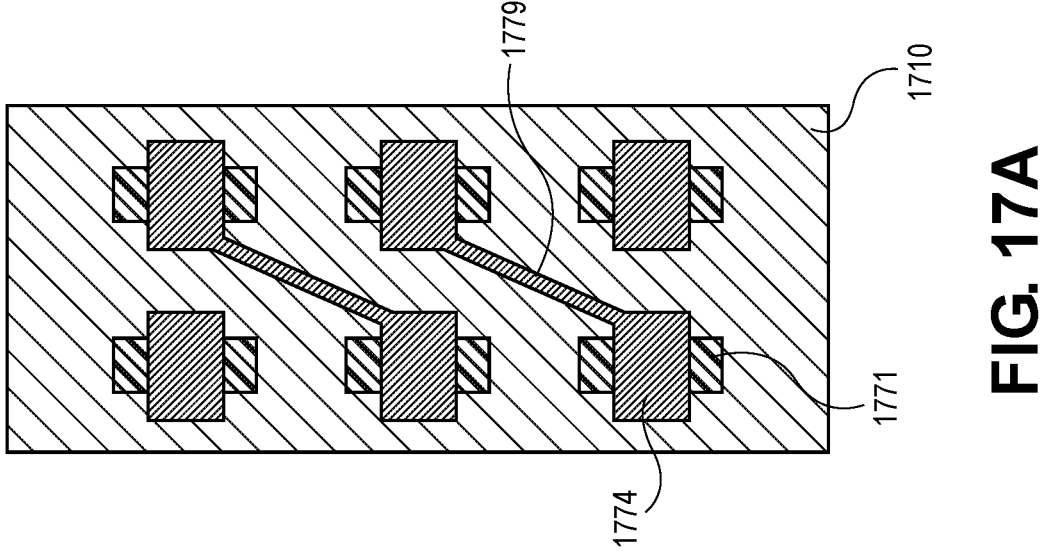
FIG. 17A is a plan view illustration of a top surface of a plurality of inductor loops that are coupled to each other in series, in accordance with an embodiment.

Referring now to FIG. 17A, a plan view illustration of a top of the multi-loop inductor is shown, in accordance with an embodiment. As shown, top traces 1774 are over the magnetic loop 1771. Additionally, top traces 1774 may be coupled to adjacent loops by traces 1779. For example, the embodiment shown in FIG. 17A include two loops that are coupled together by traces 1779.

Referring now to FIG. 17B, a plan view illustration of the opposite side of the multi-loop inductor from FIG. 17A is shown, in accordance with an embodiment. As shown, the bottom traces 1773 remain electrically isolated from the neighboring traces 1773. That is, the conductive loops may only be coupled together along the top side of the core 1710.

Referring now to FIGS. 18A-18D, plan view illustrations of the top surface of inductor loops 1830 in a glass core 1810 are shown, in accordance with various embodiments.

Figure 18A:
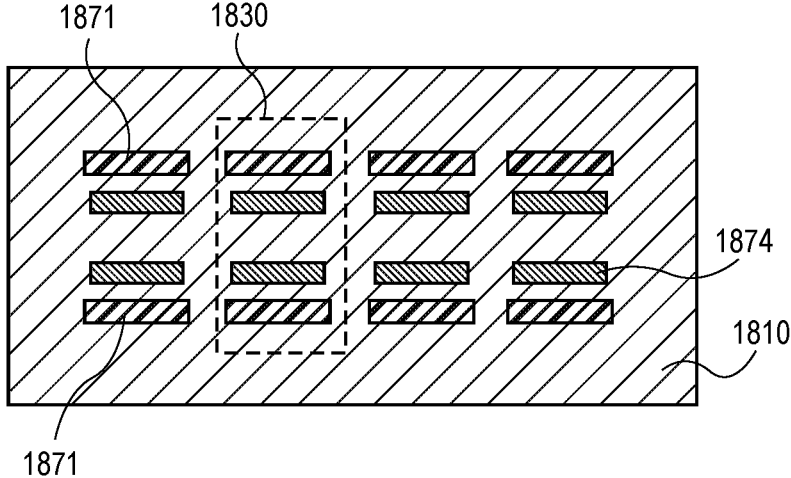
FIG. 18A is a plan view illustration of a top surface of a plurality of inductor loops with a magnetic material outside of the inductor loops, in accordance with an embodiment.

Referring now to FIG. 18A, a plan view illustration of a plurality of inductor loops 1830 is shown, in accordance with an embodiment. As shown, the magnetic portion 1871 is outside of the conductor portion.

Figure 18B:
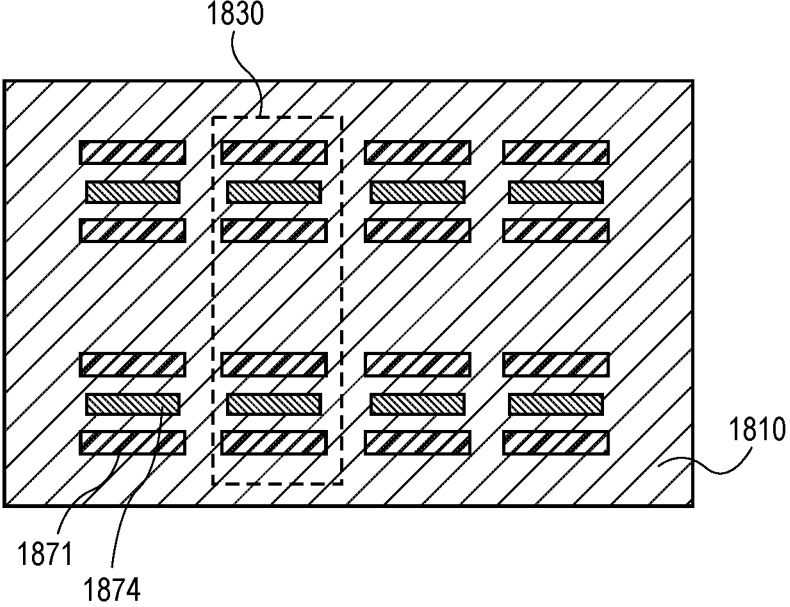
FIG. 18B is a plan view illustration of a top surface of a plurality of inductor loops with a magnetic material inside and outside of the inductor loops, in accordance with an embodiment.

Referring now to FIG. 18B, a plan view illustration of a plurality of inductor loops 1830 is shown, in accordance with an additional embodiment. As shown, the magnetic portion 1871 is both inside and outside of the conductor portion 1874.

Figure 18C:
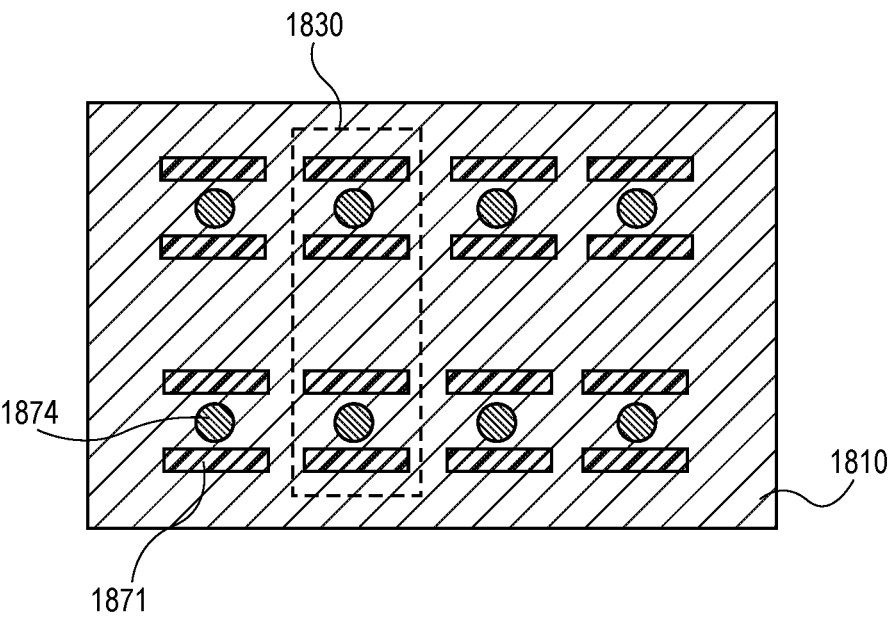
FIG. 18C is a plan view illustration of a top surface of a plurality of inductor loops with circular conductors, in accordance with an embodiment.

Referring now to FIG. 18C, a plan view illustration of inductor loops 1830 is shown, in accordance with an additional embodiment. As shown, the conductive portion 1874 may be a circular shape instead of rectangular as shown above. That is, it is to be appreciated that the conductive portion 1874 may have any desired shape. The flexibility in the shape of the conductive portion 1874 is provided, at least in part, by the flexibility of laser-assisted etching processes.

Figure 18D:
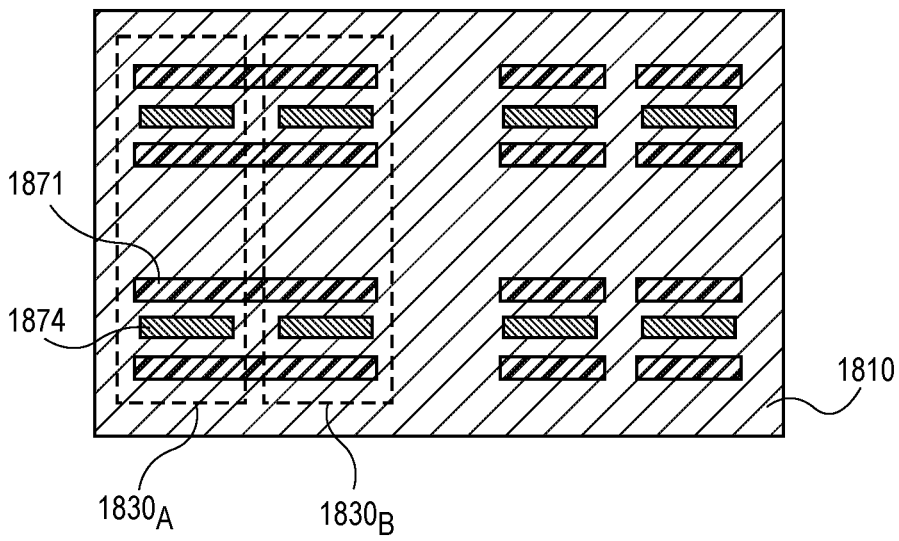
FIG. 18D is a plan view illustration of a top surface of a plurality of inductor loops where neighboring inductor loops share a common magnetic material, in accordance with an embodiment.

Referring now to FIG. 18D, a plan view illustration of inductor loops 1830 is shown, in accordance with an additional embodiment. As shown, magnetic regions 1871 may extend laterally to cover two or more inductor loops 1830. For example, inductor loops 1830A and 1830E may share a single magnetic region 1871.

Figure 19:
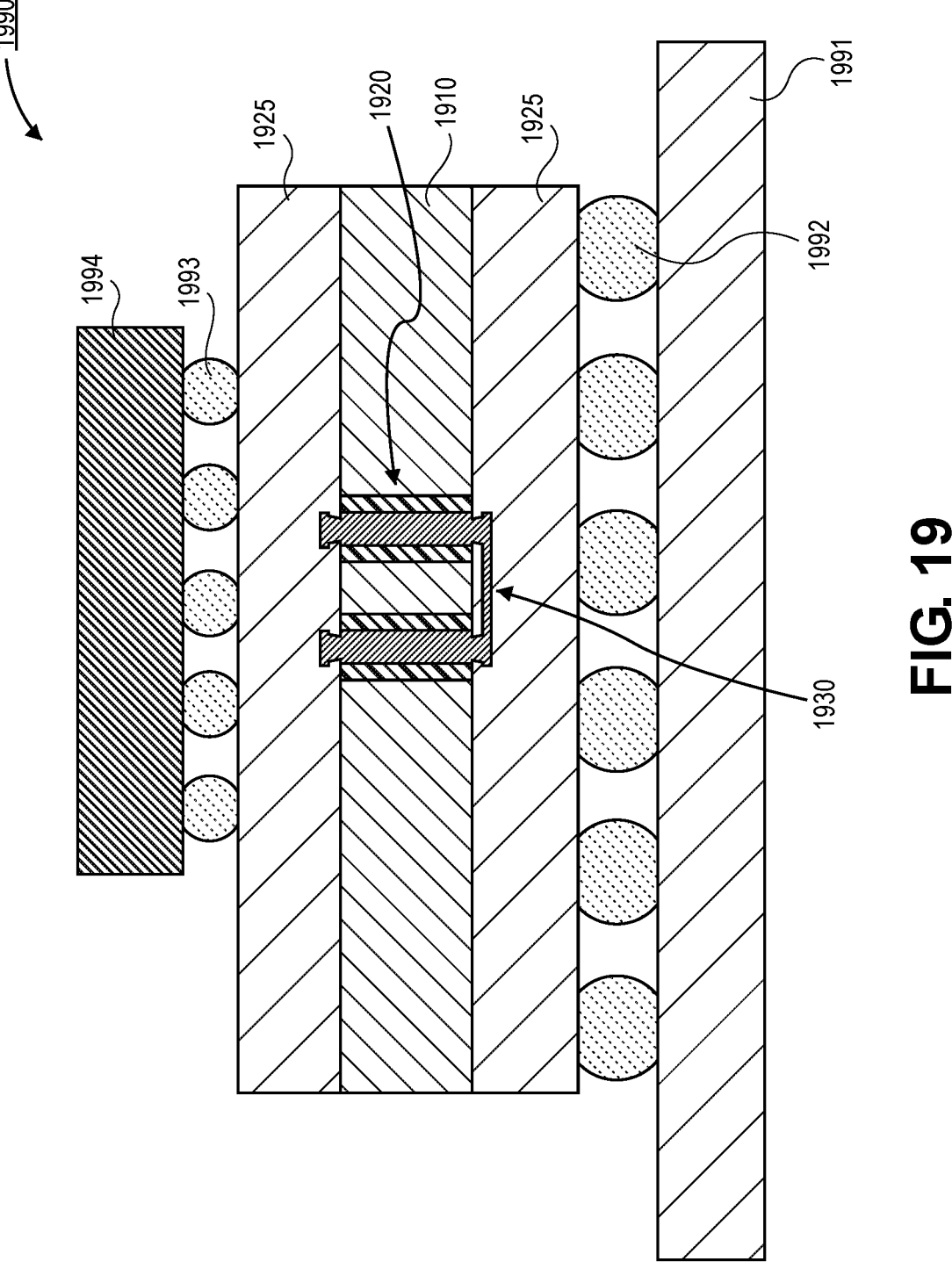
FIG. 19 is a cross-sectional illustration of an electronic system with an inductor loop within the core of the package substrate, in accordance with an embodiment.

Referring now to FIG. 19, a cross-sectional illustration of an electronic system 1900 is shown, in accordance with an embodiment. In an embodiment, the electronic system 1900 may comprise a board 1991, such as a printed circuit board (PCB) or the like. In an embodiment, the board 1991 may be coupled to a package substrate by interconnects 1992, such as solder balls, sockets, or the like. In an embodiment, the package substrate comprises a core 1910, such as a glass core 1910, and buildup layers 1925.

In an embodiment, vertically oriented inductors 1920 and/or inductor loops 1930 may be provided in the core 1910. The inductors 1920 and inductor loops 1930 may be substantially similar to any of the inductors and/or inductor loops described in greater detail above. In an embodiment, the inductors 1920 and/or inductor loops 1930 may be coupled to a die 1994 through interconnects 1993 and conductive routing (not shown) in the buildup layers 1925.

Figure 20:
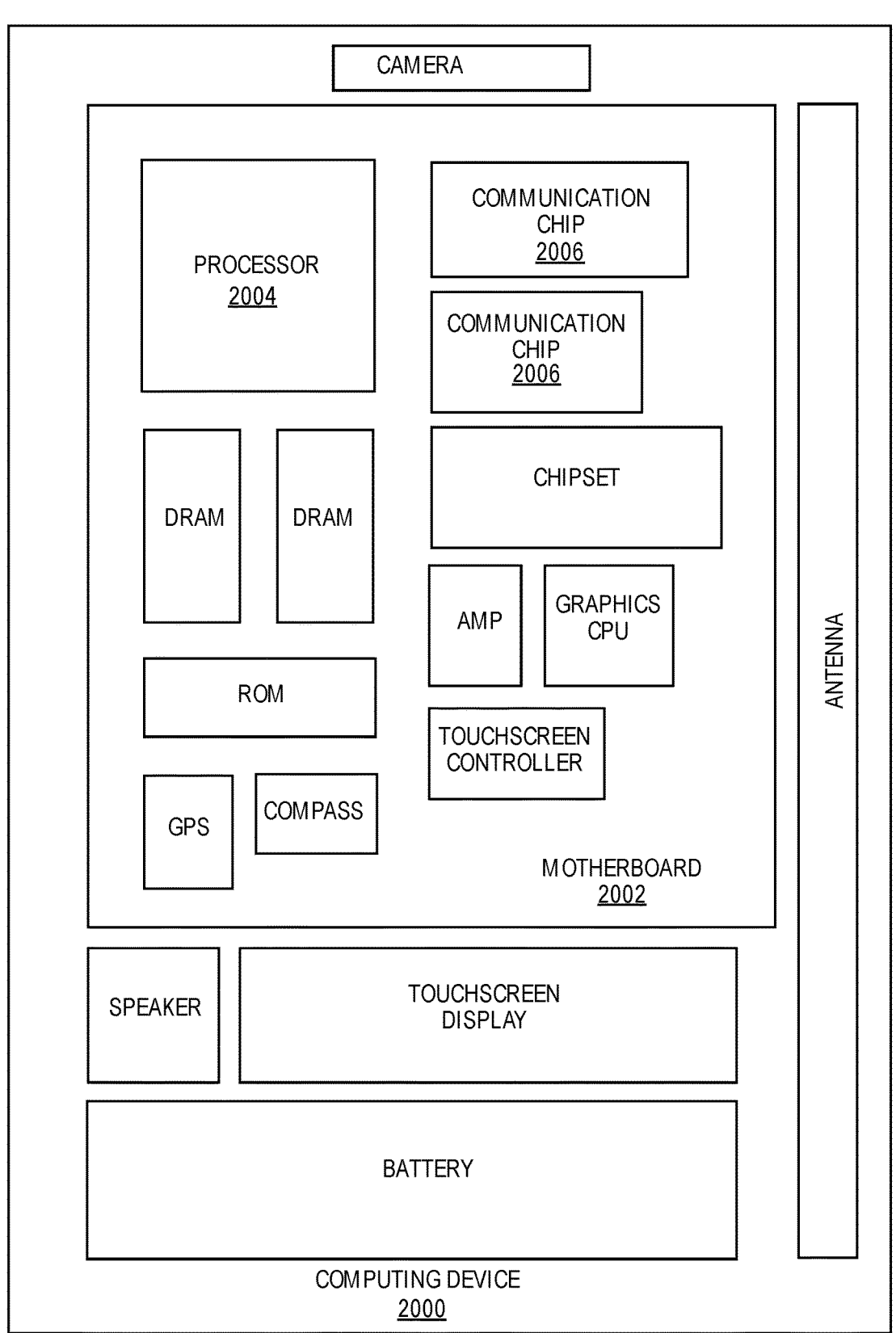
FIG. 20 is a schematic of a computing device built in accordance with an embodiment.

FIG. 20 illustrates a computing device 2000 in accordance with one implementation of the invention. The computing device 2000 houses a board 2002. The board 2002 may include a number of components, including but not limited to a processor 2004 and at least one communication chip 2006. The processor 2004 is physically and electrically coupled to the board 2002. In some implementations the at least one communication chip 2006 is also physically and electrically coupled to the board 2002. In further implementations, the communication chip 2006 is part of the processor 2004.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 2006 enables wireless communications for the transfer of data to and from the computing device 2000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 2006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 2000 may include a plurality of communication chips 2006. For instance, a first communication chip 2006 may be dedicated to shorter range wireless communications such as Wi-Fi and Bluetooth and a second communication chip 2006 may be dedicated to longer range wireless communications such as GPS, EDGE, GPRS, CDMA, WiMAX, LTE, Ev-DO, and others.

The processor 2004 of the computing device 2000 includes an integrated circuit die packaged within the processor 2004. In some implementations of the invention, the integrated circuit die of the processor may be part of an electronic package that comprises a glass core with vertically oriented inductors, in accordance with embodiments described herein. The term "processor" may refer to any device or portion of a device that processes electronic data from registers and/or memory to transform that electronic data into other electronic data that may be stored in registers and/or memory.

The communication chip 2006 also includes an integrated circuit die packaged within the communication chip 2006. In accordance with another implementation of the invention, the integrated circuit die of the communication chip may be part of an electronic package that comprises a glass core with vertically oriented inductors, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: an electronic package, comprising: a substrate, wherein the substrate comprises glass; a via opening through the substrate, wherein the via opening has an hourglass shaped profile; a magnetic layer that fills the via opening; and a via through the magnetic layer, wherein sidewalls of the via are substantially vertical.

Example 2: the electronic package of Example 1, wherein the substrate comprises a first region with a first microstructure and a second region with a second microstructure, wherein the second region lines the via opening.

Example 3: the electronic package of Example 2, wherein the first microstructure is an amorphous microstructure, and wherein the second microstructure is a crystalline microstructure.

Example 4: the electronic package of Examples 1-3, wherein the magnetic layer is a paste printed material.

Example 5: the electronic package of Examples 1-4, wherein a diameter of the via is approximately 100 μm or smaller.

Example 6: the electronic package of Example 5, wherein the diameter of the via is approximately 10 μm or smaller.

Example 7: the electronic package of Examples 1-6, wherein a diameter of the via opening is approximately 1,000 μm or less.

Example 8: the electronic package of claim 1, further comprising: a second via opening through the substrate, wherein the second via opening has the hourglass shaped profile; a second magnetic layer filling the second via opening; and a second via through the second magnetic layer, wherein sidewalls of the second via are substantially vertical.

Example 9: the electronic package of Example 8, wherein the second via is electrically coupled to the via by a trace over or under the substrate.

Example 10: a method of forming an inductor in a glass substrate, comprising: forming a via opening through the glass substrate; placing the substrate on a carrier, wherein a template structure extends up from the carrier and is inserted into the via opening; disposing a magnetic material in the via opening around the template structure; removing the template structure to provide a void in the magnetic material; and filling the void with a conductive material.

Example 11: the method of Example 10, wherein template structure is mechanically pulled out from the magnetic material.

Example 12: the method of Example 10, wherein the template structure is melted.

Example 13: the method of Example 10, wherein template structure is etched.

Example 14: the method of Examples 10-13, wherein the template structure is a post.

Example 15: the method of Example 14, wherein sidewalls of the post are substantially vertical.

Example 16: the method of Example 15, wherein sidewalls of the magnetic material are tapered.

Example 17: the method of Examples 10-17, wherein the via opening is formed with a laser-assisted etching process.

Example 18: an electronic system, comprising: a board; a package substrate coupled to the board, wherein the package substrate comprises: a substrate, wherein the substrate comprises glass; a via opening through the substrate, wherein the via opening has an hourglass shaped profile; a magnetic layer that fills the via opening; and a via through the magnetic layer, wherein sidewalls of the via are substantially vertical; and a die coupled to the package substrate.

Example 19: the electronic system of Example 18, further comprising: a second via opening through the substrate, wherein the second via opening has the hourglass shaped profile; a second magnetic layer filling the second via opening; and a second via through the second magnetic layer, wherein sidewalls of the second via are substantially vertical.

Example 20: the electronic system of Example 19, wherein the second via is electrically coupled to the via by a trace over or under the substrate.

What is claimed is:

1. An electronic package, comprising:
a substrate, wherein the substrate comprises glass; a via opening through the substrate,
wherein a region of the substrate adjacent to the via opening has an inner hourglass shaped profile and an outer vertical sidewall, the region of the substrate having a first microstructure different than a second microstructure of a remainder of the substrate adjacent to the outer vertical sidewall of the region, wherein the second microstructure is an amorphous microstructure, and wherein the first microstructure is a crystalline microstructure; a magnetic layer that fills the via opening, the magnetic layer having an outer hourglass sidewall adjacent to the inner hourglass shaped profile of the region of the substrate, and an inner vertical sidewall; and a via through the magnetic layer and adjacent to the vertical sidewall of the magnetic layer, wherein sidewalls of the via are substantially vertical.

2. The electronic package of claim 1, wherein the magnetic layer is a paste printed material.

3. The electronic package of claim 1, wherein a diameter of the via is approximately 100 μm or smaller.

4. The electronic package of claim 3, wherein the diameter of the via is approximately 10 μm or smaller.

5. The electronic package of claim 1, wherein a diameter of the via opening is approximately 1,000 μm or less.

6. The electronic package of claim 1, further comprising:
a second via opening through the substrate, wherein the second via opening has the hourglass shaped profile;
a second magnetic layer filling the second via opening; and
a second via through the second magnetic layer, wherein sidewalls of the second via are substantially vertical.

7. The electronic package of claim 6, wherein the second via is electrically coupled to the first via by a trace over or under the substrate.

8. A method of forming an inductor in a glass substrate, comprising:
forming a via opening through the glass substrate, wherein a region of the glass substrate adjacent to the via opening has an inner hourglass shaped profile and an outer vertical sidewall, the region of the glass substrate having a first microstructure different than a second microstructure of a remainder of the substrate adjacent to the outer vertical sidewall of the region, wherein the second microstructure is an amorphous microstructure, and wherein the first microstructure is a crystalline microstructure;
placing the substrate on a carrier, wherein a template structure extends up from the carrier and is inserted into the via opening;

disposing a magnetic material in the via opening around the template structure, the magnetic material having an outer hourglass sidewall adjacent to the inner hourglass shaped profile of the region of the glass substrate, and an inner vertical sidewall;
removing the template structure to provide a void in the magnetic material; and
filling the void with a conductive material adjacent to the vertical sidewall of the magnetic layer.

9. The method of claim 8, wherein template structure is mechanically pulled out from the magnetic material.

10. The method of claim 8, wherein the template structure is melted.

11. The method of claim 8, wherein the template structure is etched.

12. The method of claim 8, wherein the template structure is a post.

13. The method of claim 12, wherein sidewalls of the post are substantially vertical.

14. The method of claim 13, wherein sidewalls of the magnetic material are tapered.

15. The method of claim 8, wherein the via opening is formed with a laser-assisted etching process.

16. An electronic system, comprising: a board; a package substrate coupled to the board, wherein the package substrate comprises: a substrate, wherein the substrate comprises glass; a via opening through the substrate, wherein a region of the substrate adjacent to the via opening has an inner hourglass shaped profile and an outer vertical sidewall, the region of the substrate having a first microstructure different than a second microstructure of a remainder of the substrate adjacent to the outer vertical sidewall of the region, wherein the second microstructure is an amorphous microstructure, and wherein the first microstructure is a crystalline microstructure; a magnetic layer that fills the via opening, the magnetic layer having an outer hourglass sidewall adjacent to the inner hourglass shaped profile of the region of the substrate, and an inner vertical sidewall; and a via through the magnetic layer and adjacent to the vertical sidewall of the magnetic layer, wherein sidewalls of the via are substantially vertical; and a die coupled to the package substrate.

17. The electronic system of claim 16, further comprising:
a second via opening through the substrate, wherein the second via opening has the hourglass shaped profile;
a second magnetic layer filling the second via opening; and
a second via through the second magnetic layer, wherein sidewalls of the second via are substantially vertical.

18. The electronic system of claim 17, wherein the second via is electrically coupled to the first via by a trace over or under the substrate.

*    *    *    *    *